US012621995B2

(12) United States Patent
Chae et al.

(10) Patent No.: US 12,621,995 B2
(45) Date of Patent: *May 5, 2026

(54) NONVOLATILE MEMORY DEVICE AND METHOD FOR FABRICATING THE SAME

(71) Applicant: Samsung Electronics Co., Ltd., Suwon-si (KR)

(72) Inventors: Soodoo Chae, Seongnam-si (KR); Myoungbum Lee, Seoul (KR); HuiChang Moon, Yongin-si (KR); Hansoo Kim, Suwon-si (KR); JinGyun Kim, Yongin-si (KR); Kihyun Kim, Hwaseong-si (KR); Siyoung Choi, Seongnam-si (KR); Hoosung Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/418,720

(22) Filed: Jan. 22, 2024

(65) Prior Publication Data

US 2024/0164103 A1 May 16, 2024

Related U.S. Application Data

(63) Continuation of application No. 17/870,037, filed on Jul. 21, 2022, which is a continuation of application (Continued)

(30) Foreign Application Priority Data

Dec. 3, 2008 (KR) ........................ 10-2008-0121886
Feb. 26, 2009 (KR) ........................ 10-2009-0016406

(51) Int. Cl.
*H10B 43/27* (2023.01)
*H01L 23/498* (2006.01)
(Continued)

(52) U.S. Cl.
CPC ....... *H10B 43/27* (2023.02); *H01L 23/49844* (2013.01); *H01L 23/5226* (2013.01); (Continued)

(58) Field of Classification Search
None
See application file for complete search history.

(56) References Cited

U.S. PATENT DOCUMENTS 7,696,559 B2 4/2010 Arai et al.
7,875,922 B2 1/2011 Arai et al.
(Continued)

FOREIGN PATENT DOCUMENTS

JP 2007266143 A 10/2007
JP 2007317874 A 12/2007
(Continued)

*Primary Examiner* — Erik T. K. Peterson
(74) *Attorney, Agent, or Firm* — Wolf, Greenfield & Sacks, P.C.

(57) ABSTRACT

A three-dimensional nonvolatile memory device and a method for fabricating the same include a semiconductor substrate, a plurality of active pillars, a plurality of gate electrodes, and a plurality of supporters. The semiconductor substrate includes a memory cell region and a contact region. The active pillars extend in the memory cell region perpendicularly to the semiconductor substrate. The gate electrodes intersect the active pillars, extend from the memory cell region to the contact region and are stacked on the semiconductor substrate. The supporters extend in the contact region perpendicularly to the semiconductor substrate to penetrate at least one or more of the gate electrodes.

20 Claims, 40 Drawing Sheets

Related U.S. Application Data

No. 17/517,137, filed on Nov. 2, 2021, now Pat. No. 11,871,571, which is a continuation of application No. 17/497,417, filed on Oct. 8, 2021, which is a continuation of application No. 16/708,482, filed on Dec. 10, 2019, now Pat. No. 11,387,249, which is a continuation of application No. 15/634,597, filed on Jun. 27, 2017, now Pat. No. 10,546,872, which is a continuation of application No. 14/973,182, filed on Dec. 17, 2015, now Pat. No. 9,735,170, which is a continuation of application No. 14/027,599, filed on Sep. 16, 2013, now Pat. No. 9,245,839, which is a continuation of application No. 12/592,869, filed on Dec. 3, 2009, now Pat. No. 8,541,831.

(51) Int. Cl.

| | |
|---|---|
| *H01L 23/522* | (2006.01) |
| *H01L 23/535* | (2006.01) |
| *H10B 43/10* | (2023.01) |
| *H10B 43/20* | (2023.01) |
| *H10B 43/50* | (2023.01) |
| *H10D 30/69* | (2025.01) |
| *H10D 64/00* | (2025.01) |

(52) U.S. Cl.

CPC .......... *H01L 23/535* (2013.01); *H10B 43/10* (2023.02); *H10B 43/20* (2023.02); *H10B 43/50* (2023.02); *H10D 30/694* (2025.01); *H10D 64/118* (2025.01); *H01L 2924/0002* (2013.01)

(56) References Cited

U.S. PATENT DOCUMENTS

| | | | |
|---|---|---|---|
| 8,148,216 B2 | 4/2012 | Arai et al. | |
| 8,541,831 B2* | 9/2013 | Chae ..................... | H01L 23/535 |
| | | | 257/329 |
| 9,245,839 B2* | 1/2016 | Chae ..................... | H10B 43/20 |
| 9,735,170 B2* | 8/2017 | Chae ..................... | H10B 43/10 |
| 10,546,872 B2* | 1/2020 | Chae .................. | H01L 23/5226 |
| 11,387,249 B2* | 7/2022 | Chae ..................... | H10B 43/10 |

| | | | |
|---|---|---|---|
| 11,871,571 B2* | 1/2024 | Chae ..................... | H01L 23/535 |
| 2007/0252201 A1 | 11/2007 | Kito et al. | |
| 2008/0067583 A1 | 3/2008 | Kidoh et al. | |
| 2008/0073635 A1 | 3/2008 | Kiyotoshi et al. | |
| 2008/0099819 A1 | 5/2008 | Kito et al. | |
| 2008/0173928 A1 | 7/2008 | Arai et al. | |
| 2008/0173932 A1 | 7/2008 | Kidoh et al. | |
| 2008/0180994 A1 | 7/2008 | Katsumata et al. | |
| 2008/0186771 A1 | 8/2008 | Katsumata et al. | |
| 2009/0121271 A1 | 5/2009 | Son et al. | |
| 2009/0146190 A1 | 6/2009 | Fukuzumi et al. | |
| 2009/0146206 A1 | 6/2009 | Fukuzumi et al. | |
| 2009/0212350 A1 | 8/2009 | Kidoh et al. | |
| 2009/0230449 A1 | 9/2009 | Sakaguchi et al. | |
| 2009/0309152 A1 | 12/2009 | Knoefler et al. | |
| 2010/0006922 A1 | 1/2010 | Matsuoka et al. | |
| 2010/0090286 A1 | 4/2010 | Lee et al. | |
| 2010/0133598 A1 | 6/2010 | Chae et al. | |
| 2010/0133599 A1* | 6/2010 | Chae ..................... | H10B 43/10 |
| | | | 257/315 |
| 2010/0155818 A1 | 6/2010 | Cho et al. | |
| 2010/0207186 A1 | 8/2010 | Higashi et al. | |
| 2011/0092033 A1 | 4/2011 | Arai et al. | |
| 2011/0104869 A1 | 5/2011 | Hyun et al. | |
| 2014/0015128 A1* | 1/2014 | Chae ................. | H01L 23/49844 |
| | | | 257/737 |
| 2016/0111440 A1* | 4/2016 | Chae ..................... | H10B 43/50 |
| | | | 257/314 |
| 2017/0301690 A1* | 10/2017 | Chae .................. | H01L 23/5226 |
| 2020/0111811 A1* | 4/2020 | Chae ..................... | H01L 23/535 |
| 2022/0037355 A1* | 2/2022 | Chae .................. | H01L 23/5226 |
| 2022/0059567 A1* | 2/2022 | Chae ..................... | H10B 43/20 |
| 2022/0359566 A1* | 11/2022 | Chae ..................... | H10B 43/10 |
| 2024/0155840 A1* | 5/2024 | Chae ..................... | H10B 43/50 |
| 2024/0164103 A1* | 5/2024 | Chae .................. | H01L 23/5226 |

FOREIGN PATENT DOCUMENTS

| | | | |
|---|---|---|---|
| JP | 2008072051 A | | 3/2008 |
| JP | 2008159699 A | | 7/2008 |
| JP | 2008171918 A | | 7/2008 |
| JP | 6338602 B2 | | 5/2018 |
| KR | 100884861 B1 | | 2/2009 |
| KR | 100921287 B1 | | 10/2009 |

* cited by examiner

NONVOLATILE MEMORY DEVICE AND METHOD FOR FABRICATING THE SAME

CROSS-REFERENCE TO RELATED APPLICATIONS

The present application is a continuation application of and claims priority from U.S. patent application Ser. No. 17/870,037, filed on Jul. 21, 2022, which is a continuation application of and claims priority from U.S. patent application Ser. No. 17/517,137, filed on Nov. 2, 2021, now U.S. Pat. No. 11,871,571, which is a continuation application of and claims priority from U.S. patent application Ser. No. 17/497,417, filed on Oct. 8, 2021, which is a continuation application of and claims priority from U.S. patent application Ser. No. 16/708,482, filed on Dec. 10, 2019, now U.S. Pat. No. 11,387,249, which is a continuation application of and claims priority from U.S. patent application Ser. No. 15/634,597, filed on Jun. 27, 2017, now U.S. Pat. No. 10,546,872, which is a continuation application of and claims priority from U.S. patent application Ser. No. 14/973, 182, filed on Dec. 17, 2015, now U.S. Pat. No. 9,735,170, which is a continuation application of and claims priority from U.S. patent application Ser. No. 14/027,599, filed on Sep. 16, 2013, now U.S. Pat. No. 9,245,839, which is a continuation application of and claims priority from U.S. patent application Ser. No. 12/592,869, filed on Dec. 3, 2009, now U.S. Pat. No. 8,541,831, which claims the benefit of Korean Patent Application Nos. 10-2008-0121886, filed on Dec. 3, 2008, and 10-2009-0016406, filed on Feb. 26, 2009, the entire contents of which are hereby incorporated by reference.

BACKGROUND

The present inventive concept relates to nonvolatile memory devices and methods for fabricating the same, and more particularly, to three-dimensional nonvolatile memory devices capable of reducing the resistance of gate electrodes and preventing process defects, and methods for fabricating the same.

Nonvolatile memory devices can electrically erase and write (or program) data and can retain data even when the power supply is interrupted. Accordingly, the use of nonvolatile memory devices is increasing in various fields.

Nonvolatile memory devices include various types of memory cell transistors. Nonvolatile memory devices are classified into NAND-type nonvolatile memory devices and a NOR-type nonvolatile memory device, depending on the cell array structures. The NAND-type nonvolatile memory device and the NOR-type nonvolatile memory device have the advantages and disadvantages of high integration and high operation speed.

In particular, the NAND-type nonvolatile memory device is advantageous for high integration because it includes a cell string structure having a plurality of memory cell transistors connected in series. Also, the NAND-type nonvolatile memory device has a much higher data update speed than the NOR-type nonvolatile memory device because it uses an operation scheme of simultaneously changing data stored in a plurality of memory cell transistors. Due to such a high integration level and high update speed, the NAND-type nonvolatile memory device is widely used in portable electronic products requiring mass storage, such as digital cameras and MP3 players.

Research is being conducted to facilitate and promote the advantages of NAND-type nonvolatile memory devices. Accordingly, a three-dimensional nonvolatile memory device is being developed.

SUMMARY OF THE INVENTIVE CONCEPT

Embodiments of the inventive concept provide three-dimensional nonvolatile memory devices capable of reducing the resistance of gate electrodes, and methods for fabricating the same.

Embodiments of the inventive concept also provide three-dimensional nonvolatile memory devices capable of preventing process defects, and methods for fabricating the same.

According to one aspect, the inventive concept is directed to a nonvolatile memory device including: a semiconductor substrate including a memory cell region and a contact region; a plurality of active pillars extending in the memory cell region perpendicular to the semiconductor substrate; a plurality of gate electrodes that intersect the active pillars, extend from the memory cell region to the contact region and are stacked on the semiconductor substrate; and a plurality of supporters extending in the contact region perpendicular to the semiconductor substrate to penetrate at least one or more of the gate electrodes.

In one embodiment, the supporters are formed of dielectric material or semiconductor material.

In one embodiment, the supporters penetrate all or some of the gate electrodes.

In one embodiment, the gate electrodes are stacked on the semiconductor substrate, with an interlayer dielectric therebetween, and the areas of the gate electrodes decrease with an increase in the distance from the semiconductor substrate.

In one embodiment, the gate electrodes are stacked on the semiconductor substrate, with an interlayer dielectric therebetween; the upper gate electrode among the gate electrodes exposes an edge portion of the lower gate electrode; and the supporters are disposed at the exposed edge portion of the lower gate electrode.

In one embodiment, the length of the supporters decreases from the center of the gate electrodes toward the edge.

In one embodiment, the active pillars penetrate the gate electrodes or intersect one sidewall of the gate electrodes.

In one embodiment, the contact region is disposed around the memory cell region.

In one embodiment, the contact region is disposed at both side portions of the memory cell region.

In one embodiment, the active pillars are arranged two-dimensionally on the semiconductor substrate, and the gate electrode is connected to at least four or more of the two-dimensionally arranged active pillars or to at least two or more of the one-dimensionally arranged active pillars.

According to another aspect, the inventive concept is directed to a method for fabricating a nonvolatile memory device including: forming a stack structure, in which first and second dielectric layers with different etch rates are stacked alternately at least two or more times, on a semiconductor substrate; forming active pillars connected to the semiconductor substrate by penetrating the first and second dielectric layers; forming trenches penetrating the stack structure between the active pillars to form line-type stack structures; forming horizontal supporters contacting the top surfaces of the line-type stack structures, across the line-type stack structures adjacent to each other; removing the second dielectric layers to form openings between the first dielectric layers; and forming conductive patterns locally in the openings.

In one embodiment, the horizontal supporters maintain the interval between the line-type stack structures. In one embodiment, the horizontal supporters are line patterns that intersect the top surfaces of the line-type stack structures.

In one embodiment, the horizontal supporters are patterns that are locally formed across the top surfaces of the line-type stack structures adjacent to each other.

In one embodiment, the forming of the horizontal supporters further comprises filling the trenches with a sacrificial dielectric layer and forming the horizontal supporters contacting the top surfaces of the sacrificial dielectric layer and the line-type stack structure. In one embodiment, the horizontal supporters are formed of a material having an etch selectivity with respect to the second dielectric layer and the sacrificial dielectric layer. In one embodiment, the method further comprises, before the forming of the openings, removing the sacrificial dielectric layer to expose the sidewalls of the line-type stack structures. In one embodiment, the sacrificial dielectric layer is formed of a material having an etch selectivity with respect to the first dielectric layer.

In one embodiment, the method further comprises forming vertical supporters penetrating the edge portions of the first dielectric layers.

In one embodiment, the forming of the conductive patterns fills the openings between the vertically-adjacent first dielectric layers, and the conductive patterns surround the active pillars and the vertical supporters.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

FIG. 1 is a circuit diagram of a nonvolatile memory device according to exemplary embodiments of the inventive concept.

4

Figure 6:
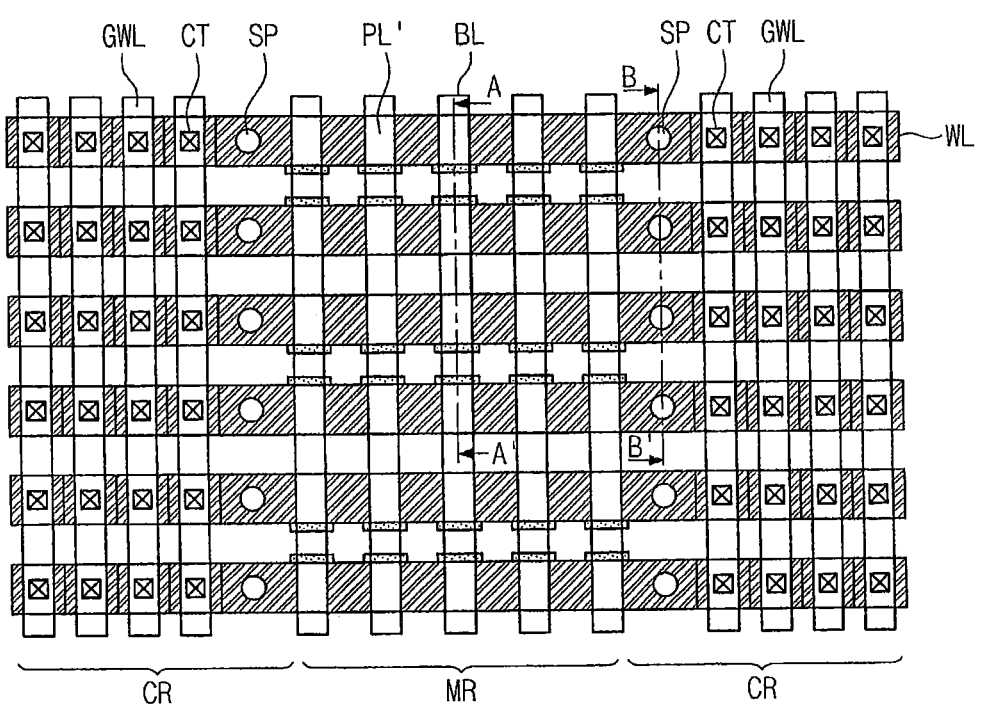
FIG. 6 is a plan view of a nonvolatile memory device according to a third exemplary embodiment of the inventive concept.
Figure 7:
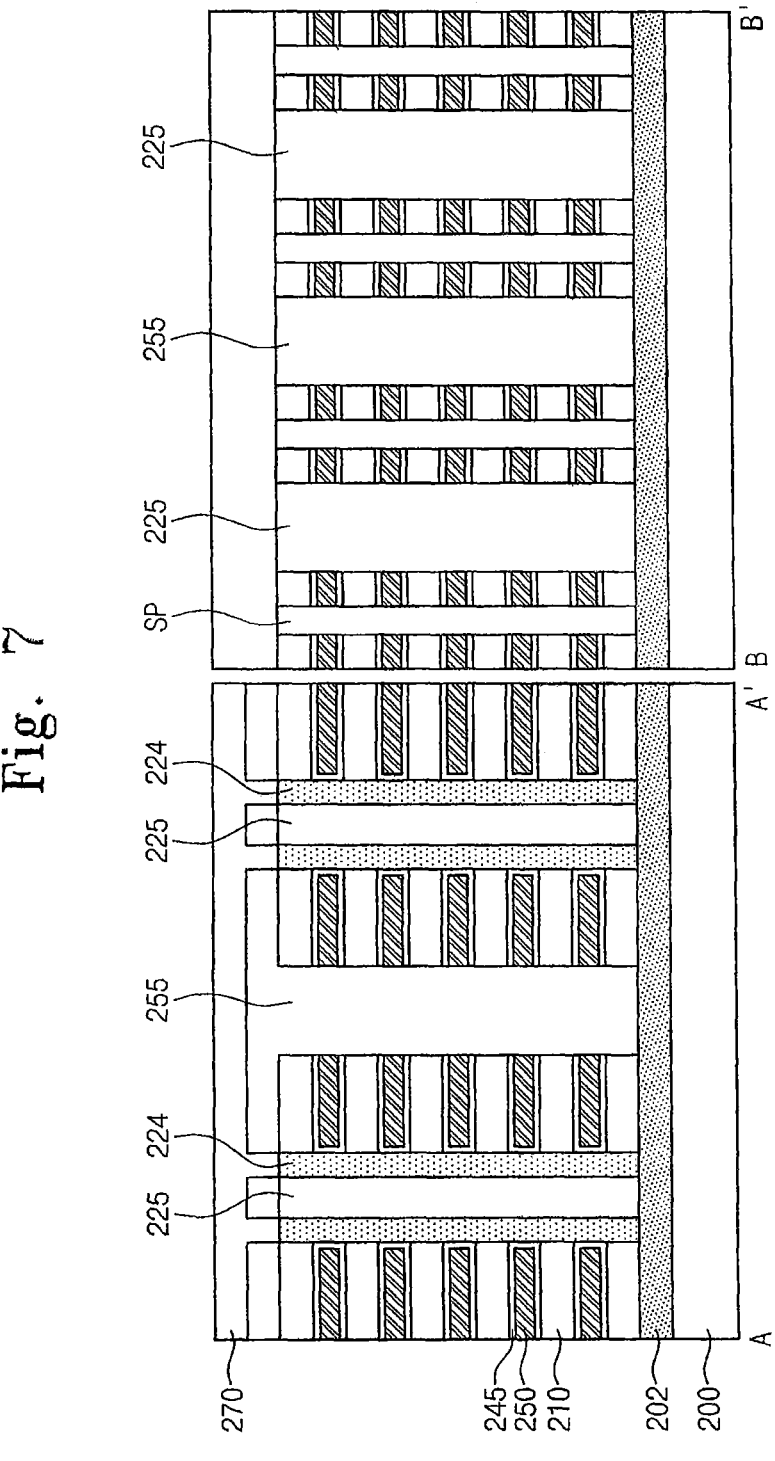

FIG. 7 is a sectional view of the nonvolatile memory device according to the third exemplary embodiment of the inventive concept, which is taken along lines A-A' and B-B' of FIG. 6.

Figure 8:
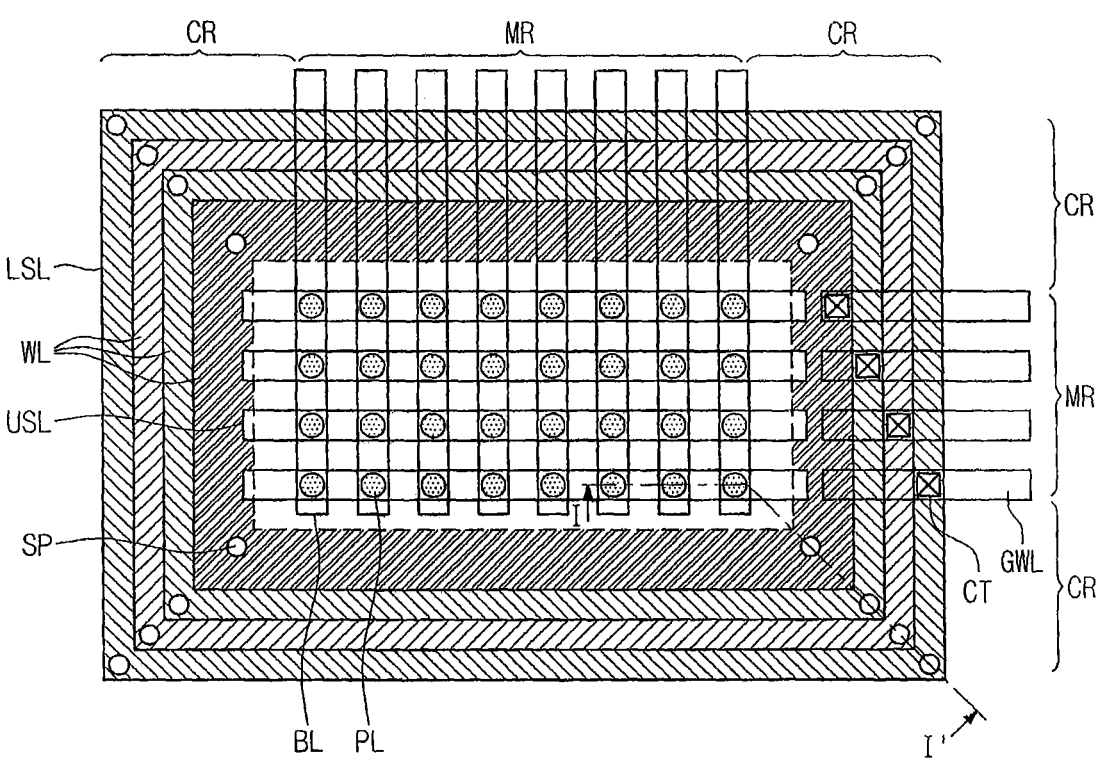

FIG. 8 is a plan view of a nonvolatile memory device according to a forth exemplary embodiment of the inventive concept.

Figure 9:
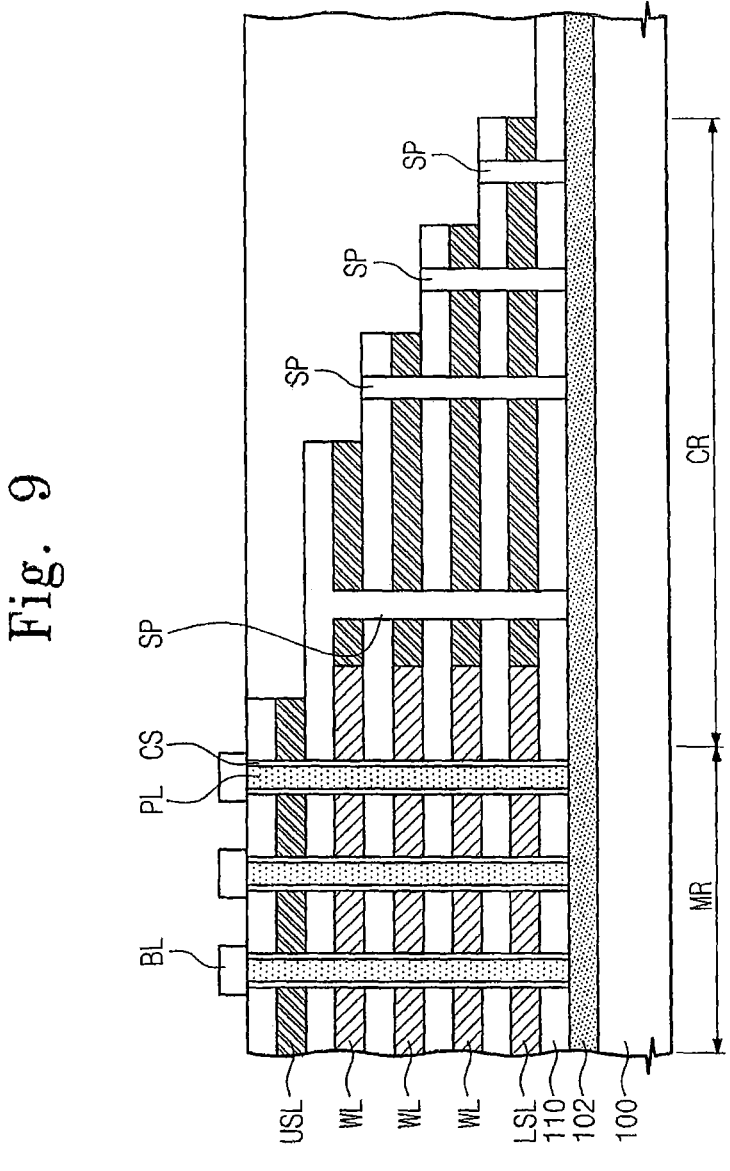

FIG. 9 is a sectional view of the nonvolatile memory device according to the forth exemplary embodiment of the inventive concept, which is taken along a line I-I' of FIG. 8.

Figure 10:
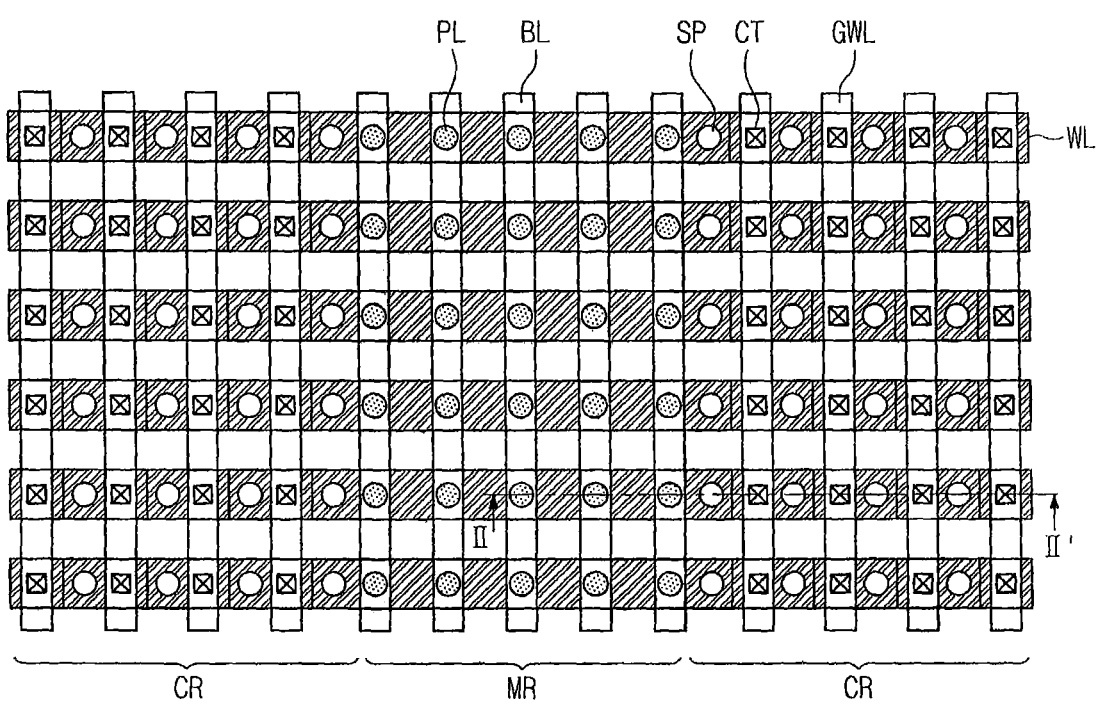

FIG. 10 is a plan view of a nonvolatile memory device according to a fifth exemplary embodiment of the inventive concept.

Figure 11:
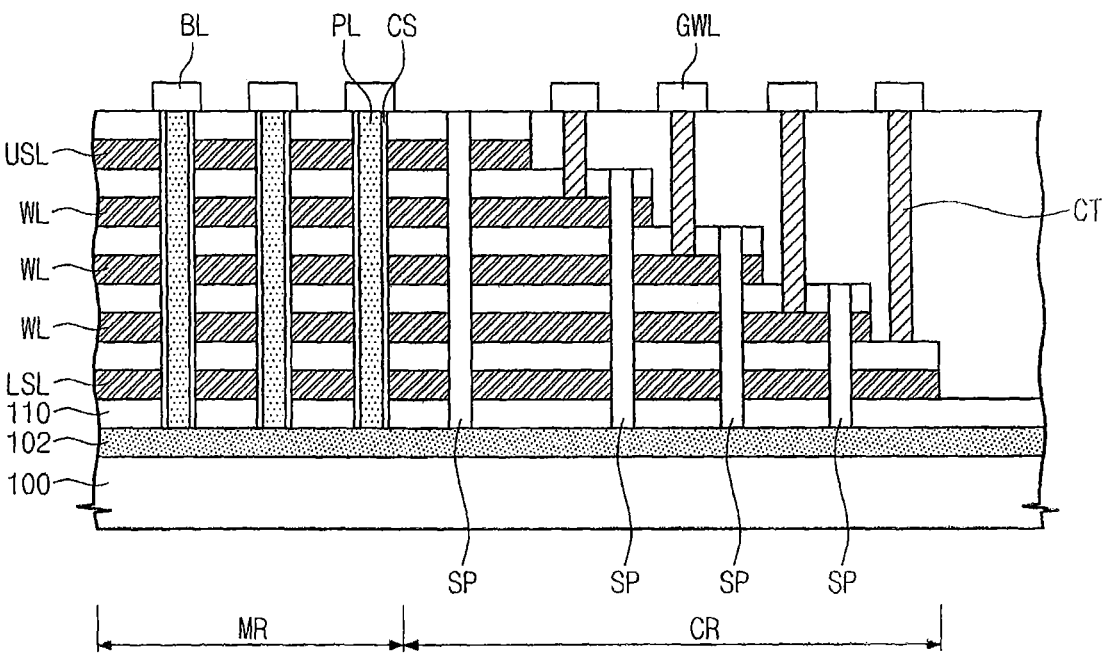

FIG. 11 is a sectional view of the nonvolatile memory device according to the fifth exemplary embodiment of the inventive concept, which is taken along a line II-II' of FIG. 10.

Figure 12:
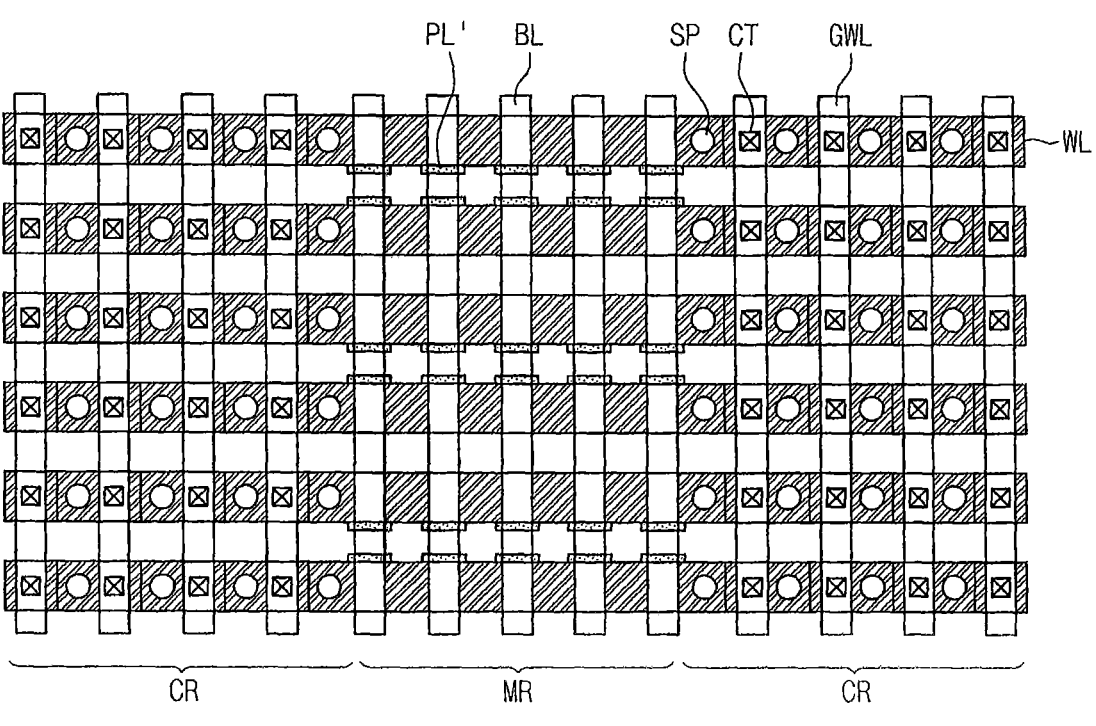

FIG. 12 is a plan view of a nonvolatile memory device according to a sixth exemplary embodiment of the inventive concept.

FIGS. 13A to 13G are sectional views illustrating a method for fabricating the nonvolatile memory devices according to the first and forth exemplary embodiments of the inventive concept.

FIGS. 14A to 14F are sectional views illustrating a method for fabricating the nonvolatile memory devices according to the second and fifth exemplary embodiments of the inventive concept.

FIGS. 15A to 15E are sectional views illustrating another method for fabricating the nonvolatile memory devices according to the second and fifth exemplary embodiments of the inventive concept.

FIGS. 16A to 16E are sectional views illustrating a method for fabricating the nonvolatile memory devices according to the third and sixth exemplary embodiments of the inventive concept.

FIGS. 17 to 24 are sectional views illustrating a method for fabricating a nonvolatile memory device according to another exemplary embodiment of the inventive concept.

Figure 25:
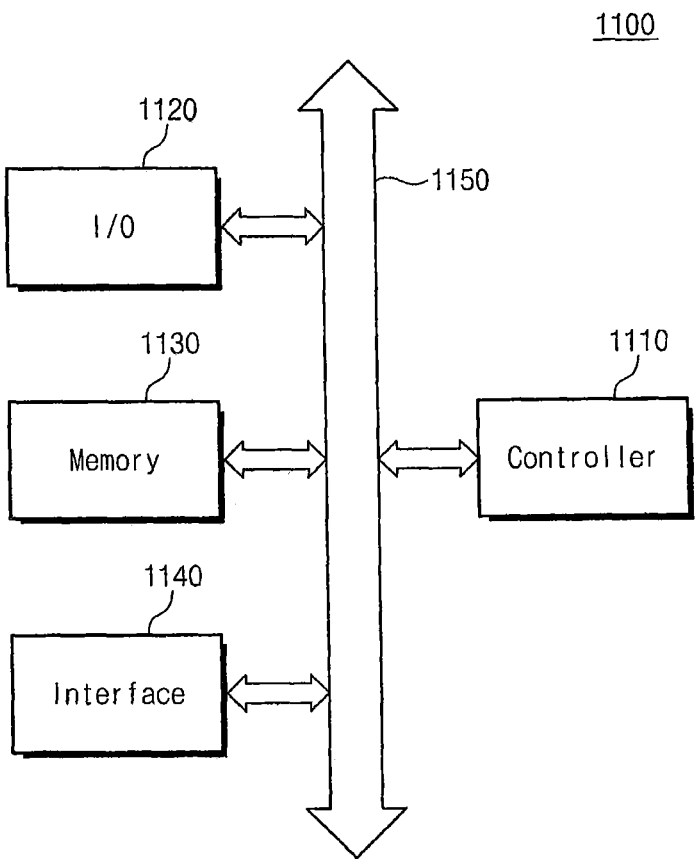

FIG. 25 is a block diagram of a memory system including a nonvolatile memory device according to exemplary embodiments of the inventive concept.

Figure 26:
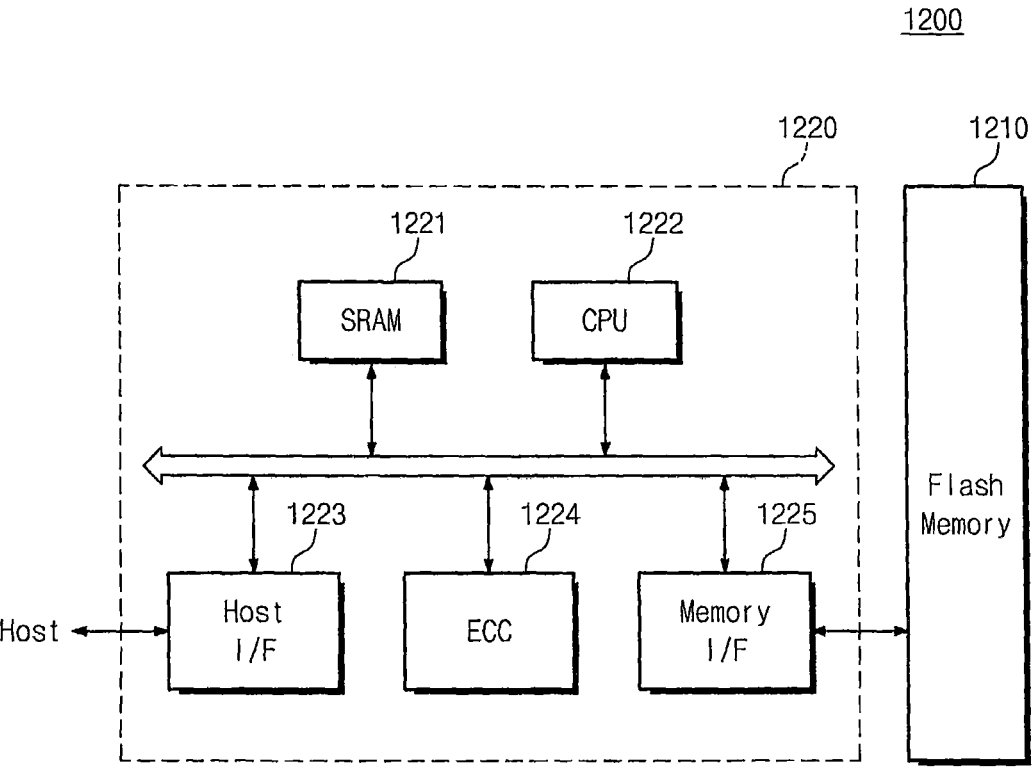

FIG. 26 is a block diagram of a memory card provided with a flash memory device according to an exemplary embodiment of the inventive concept.

Figure 27:
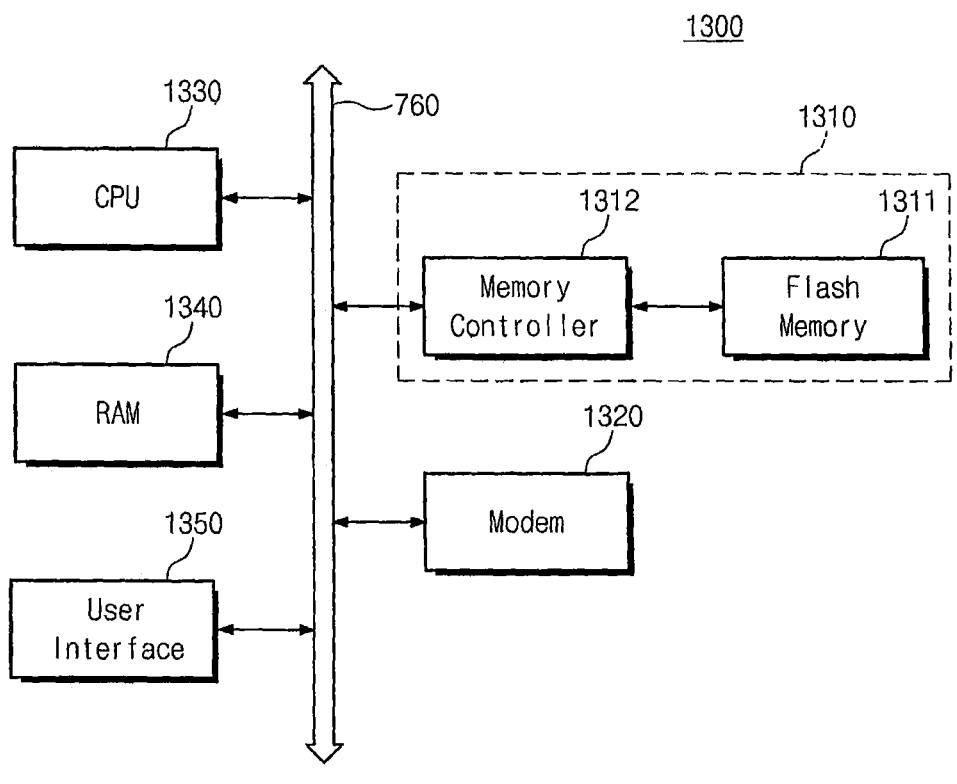

FIG. 27 is a block diagram of an information processing system provided with a flash memory system according to the inventive concept.

DETAILED DESCRIPTION OF THE EMBODIMENTS

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this description will be thorough and complete, and will fully convey the inventive concept to those skilled in the art. Throughout the specification, like reference numerals refer to like elements.

In the following description, the technical terms are used only for describing specific exemplary embodiments while not limiting the inventive concept. The terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components. It will also be understood that when a layer (or film) is referred to as being "on" another layer or substrate, it can be directly on the other layer or substrate, or intervening layers may also be present.

Additionally, the embodiments in the detailed description will be described with reference to sectional views or plan views as ideal exemplary views of the inventive concept. In the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, although an etched region is illustrated as being angled, it may also be rounded. Areas exemplified in the drawings have general properties, and are used to illustrate specific shapes of device regions. Thus, these should not be construed as limiting the scope of the inventive concept.

Hereinafter, exemplary embodiments of the inventive concept will be described in detail with reference to the accompanying drawings. Nonvolatile memory devices according to the exemplary embodiments of the inventive concept have a three-dimensional structure.

Figure 1:
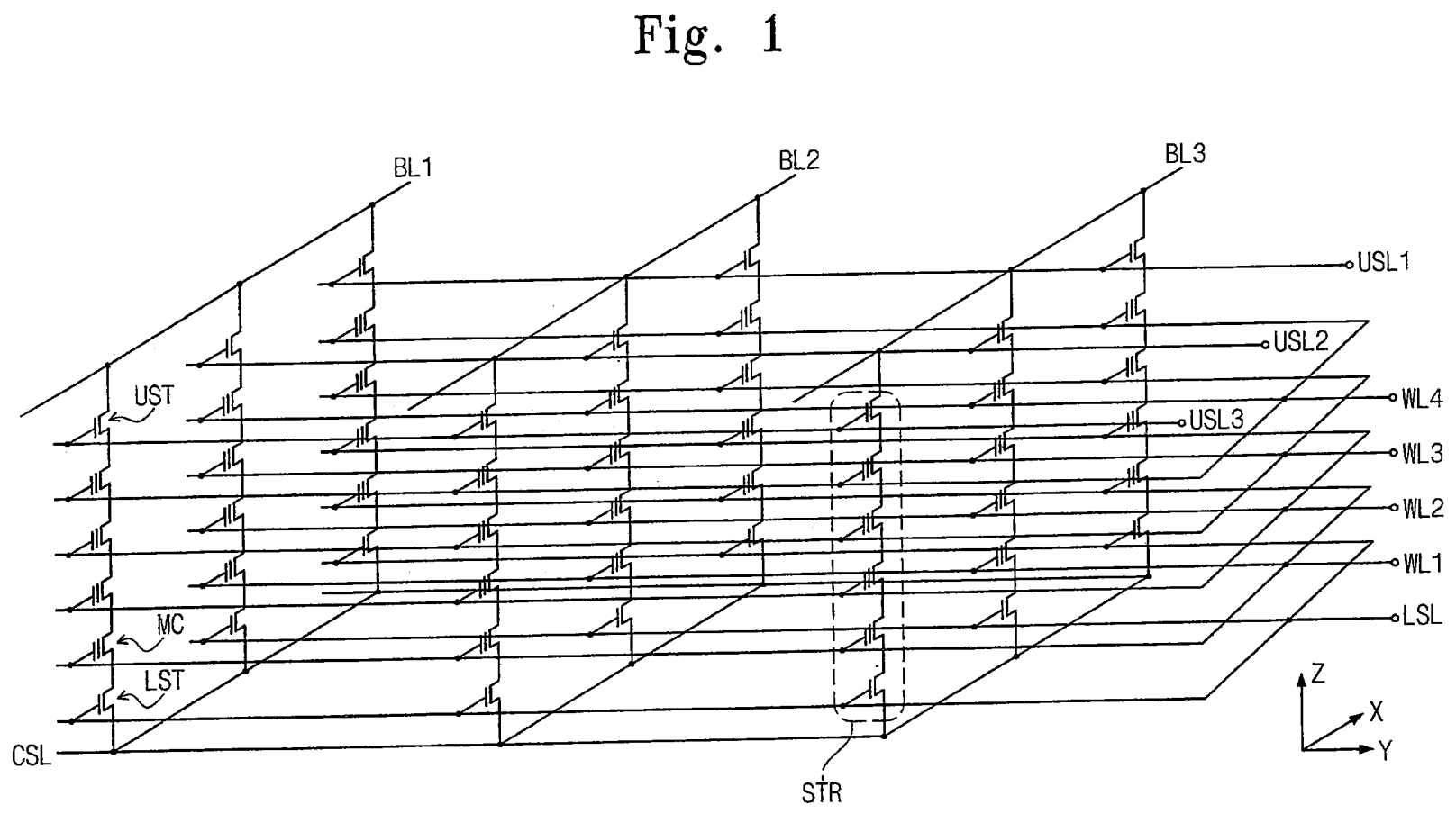

FIG. 1 is a circuit diagram of a nonvolatile memory device according to exemplary embodiments of the inventive concept.

Referring to FIG. 1, a nonvolatile memory device according to exemplary embodiments of the inventive concept includes a cell array including a plurality of strings STR. The cell array includes bit lines BL1~BL3, word lines WL1~WL4, upper and lower select lines USL1~USL3 and LSL, and a common source line CSL. The strings STR are provided between the common source line CSL and the bit lines BL1~BL3.

Each string STR includes upper and lower select transistors UST and LST, and memory cell transistors MC that are connected in series between the upper and lower select transistors UST and LST. The drains of the upper select transistors UST are connected to the bit lines BL1~BL3, and the sources of the lower select transistors LST are connected in common to the common source line CSL.

The upper select transistors UST are connected to the upper select lines USL1~USL3, and the lower select transistors LST are connected respectively to the lower select lines LSL. The memory cells MC are connected respectively to the word lines WL1~WL4.

The cell array has a three-dimensional structure. That is, the strings STR are configured in such a way that the memory cells MC are connected in series in a Z-axis direction perpendicular to an XY plane parallel to the top surface of a semiconductor substrate. Accordingly, the channel of the memory cell transistors MC and the select transistors UST and LST may be formed perpendicular to the XY plane.

In the three-dimensional nonvolatile memory device, 'm' memory cells may be formed on each XY plane, and XY planes with 'm' memory cells may be stacked in 'n' layers (where 'm' and 'n' are natural numbers).

Hereinafter, a nonvolatile memory device according to a first exemplary embodiment of the inventive concept will be described with reference to FIGS. 2A to 2C and FIG. 3.

Figure 2A:
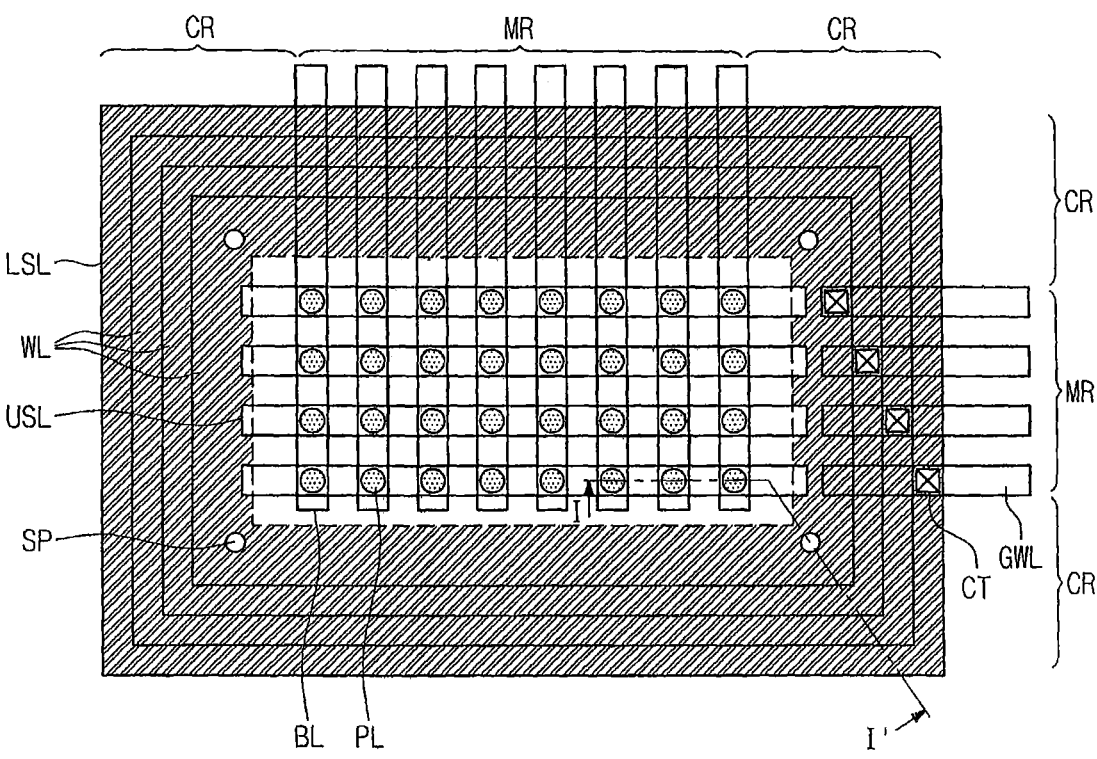
FIG. 2A is a plan view of a nonvolatile memory device according to a first exemplary embodiment of the inventive concept.
Figure 2B:
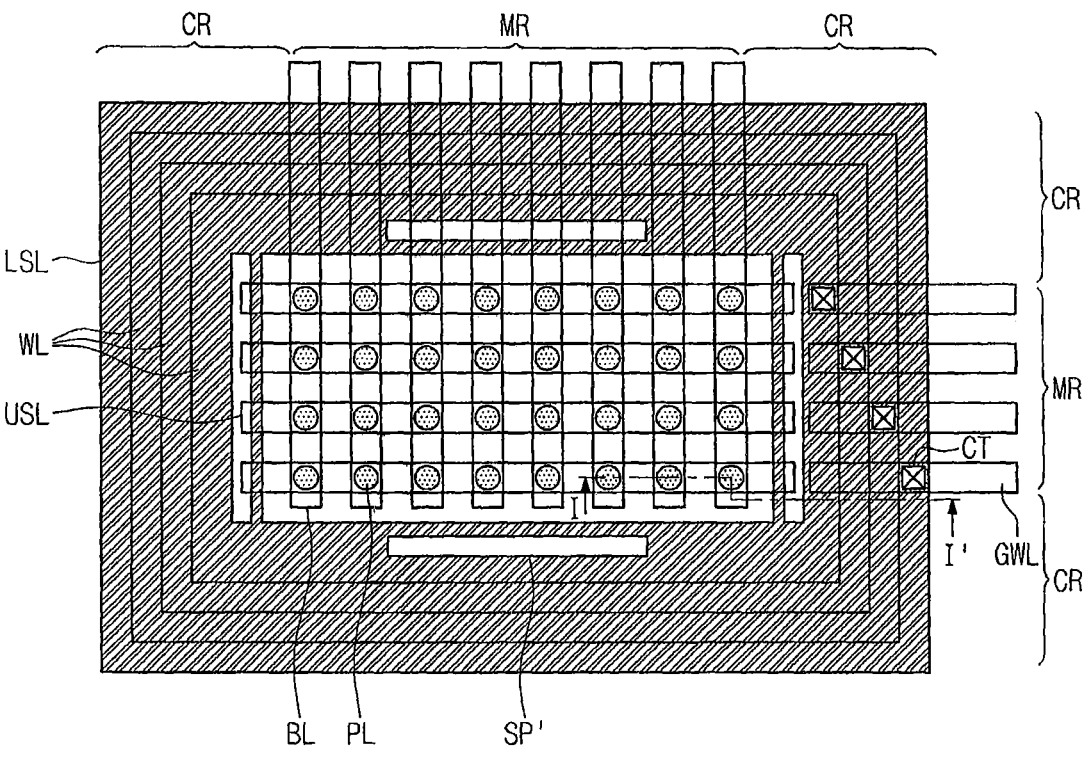
FIGS. 2B and 2C are plan views of nonvolatile memory devices according to modifications of the first exemplary embodiment of the inventive concept.
Figure 2C:
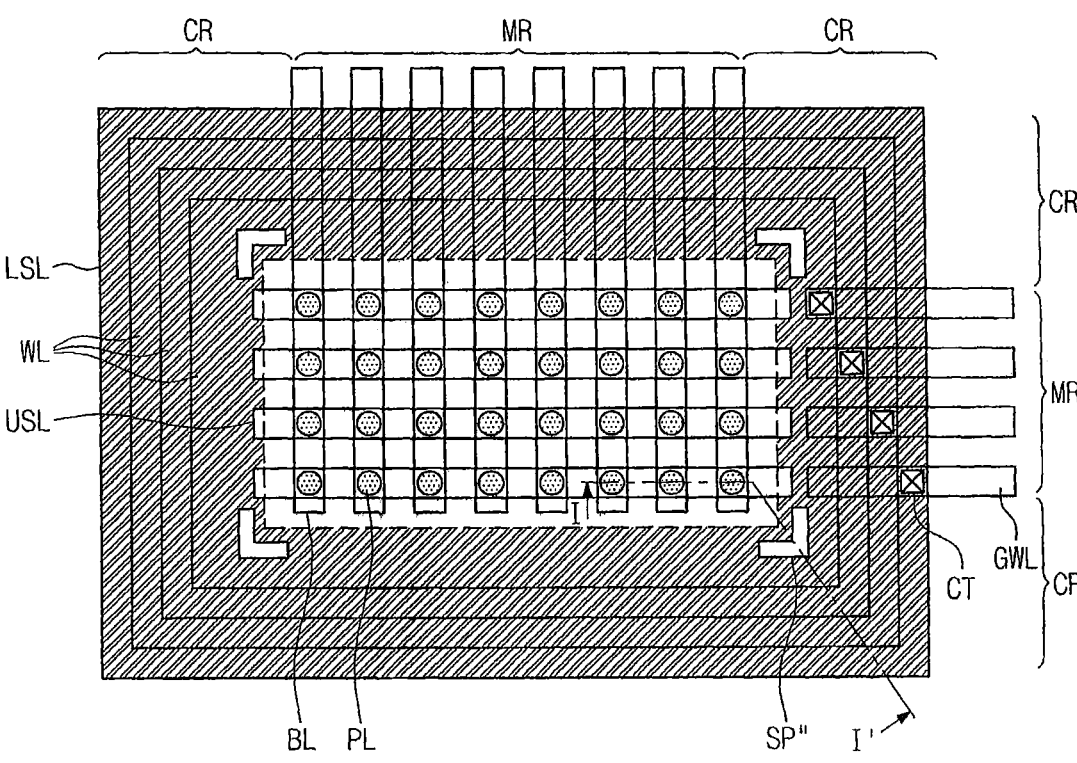
Figure 3:
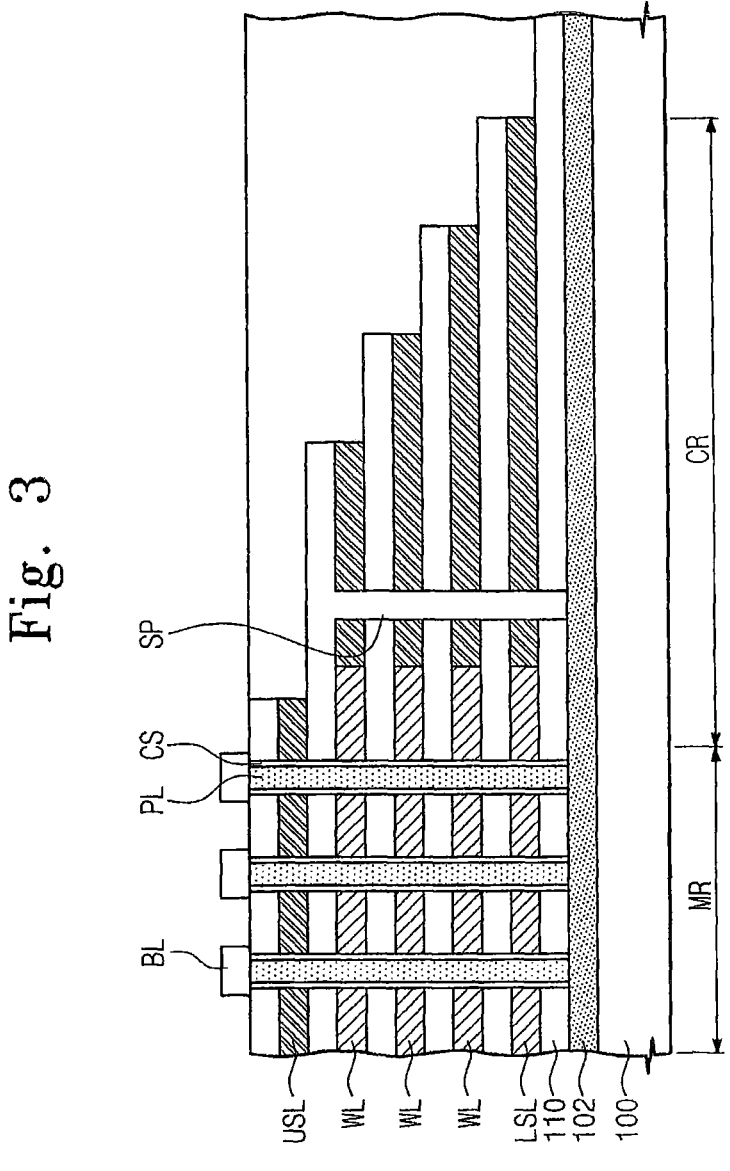
FIG. 3 is a sectional view of the nonvolatile memory device according to the first exemplary embodiment of the inventive concept, which is taken along a line I-I' of FIGS. 2A to 2C.

FIG. 2A is a plan view of a nonvolatile memory device according to a first exemplary embodiment of the inventive concept. FIGS. 2B and 2C are plan views of nonvolatile memory devices according to modifications of the first exemplary embodiment of the inventive concept. FIG. 3 is a sectional view of the nonvolatile memory device according to the first exemplary embodiment of the inventive concept, which is taken along a line I-I' of FIGS. 2A to 2C.

Referring to FIGS. 2A and 3, interlayer dielectrics 110 and gate electrodes LSL, WL and USL are alternately stacked on a semiconductor substrate 100. More specifically, the semiconductor substrate 100 includes a memory cell region MR and a contact region CR that is disposed on the edge portion of the memory cell region MR. In the first exemplary embodiment of the inventive concept, the contact region CR is disposed around the memory cell region MR. In exemplary embodiments of the inventive concept, the memory cell region MR and the contact region CR are regions for gate electrodes.

An impurity region (or well) 102, provided as a common source line (CSL of FIG. 1), is formed in the semiconductor substrate 100, and interlayer dielectrics 110 and gate electrodes LSL, WL and USL are alternately stacked on the impurity region 102. Among the stacked gate electrodes LSL, WL and USL, the lowermost and uppermost gate electrodes LSL and USL are used as select lines, and the other gate electrodes WL are used as word lines.

The lower select line LSL (i.e., the lowermost gate electrode) may be formed in the shape of a plate or in the shape of lines separated from each other. The upper select line USL (i.e., the uppermost gate electrode) may be formed in the shape of lines separated from each other. The word lines WL between the lower select line LSL and the upper select line USL may be formed in the shape of a plate. Also, the areas of the gate electrodes LSL, WL, and USL may decrease with an increase in the distance from the semiconductor substrate 100.

More specifically, the gate electrodes LSL, WL and USL may extend from the memory cell region MR to the contact region CR. The gate electrodes LSL, WL and USL of the memory cell region MR and the gate electrodes of the contact region CR may be formed of different conductive materials. That is, the gate electrodes LSL, WL and USL of the memory cell region MR may be formed of polysilicon, while the gate electrodes LSL, WL and USL of the contact region CR may comprise metal material that is lower in specific resistance than polysilicon. For example, the gate electrodes LSL, WL and USL of the contact region CR may be formed of tungsten (W), aluminum (Al), titanium (Ti), or tantalum (Ta). Accordingly, the resistance of the gate electrodes LSL, WL and USL can be reduced in comparison with the case where the gate electrodes LSL, WL and USL are formed of polysilicon. Therefore, a signal delay due to an increase in the resistance of the gate electrodes LSL, WL and USL can be reduced, thus making it possible to improve the operation speed of the nonvolatile memory device. For the uppermost line-shaped gate electrodes USL, both the memory cell region MR and the contact region MR may comprise metal material.

Active pillars PL are formed in the memory cell region MR perpendicular to the plane of the semiconductor substrate 100. The active pillars PL are formed of semiconductor material. The active pillars PL may penetrate the gate electrodes LSL, WL and USL of the memory cell region MR. The pillars PL may be spaced apart from each other, and may be arranged in a matrix configuration on a plane. Also, the active pillars PL may be electrically connected to the impurity region 102 of the semiconductor substrate 100 by penetrating the gate electrodes LSL, WL and USL. The active pillars PL are provided for the channels of transistors, which correspond to the strings of the nonvolatile memory device according to the embodiments of the inventive concept. That is, the channels of memory cell transistors and select transistors (LST, UST and MC of FIG. 1) in each string may be electrically connected through the active pillars PL.

Also, in the memory cell region MR, a charge storage layer CS is formed to surround each of the active pillars PL. That is, the charge storage layer CS is disposed between the active pillar PL and the gate electrodes LSL, WL and USL. Also, bit lines are electrically connected on the active pillars PL.

The gate electrodes LSL, WL and USL of the contact region CR may be stacked in the shape of a stair. That is, the areas of the plate-type gate electrodes LSL, WL and USL stacked on the semiconductor substrate 100 may decrease with an increase in the distance from the semiconductor substrate 100, so that the upper gate electrode may be stacked to expose the end portion of the lower gate electrode. That is, the end portion of each of the gate electrodes LSL, WL and USL is not aligned with the sidewalls of the upper and lower gate electrodes LSL, WL and USL. Therefore, the gate electrodes LSL, WL and USL of the contact region CR may be electrically connected through contacts CT to global word lines GWL.

Also, in the contact region CR, supporters SP may penetrate some of the gate electrodes LSL, WL and USL. The supporters SP may serve to support the edge portions of the interlayer dielectrics 110 and the gate electrodes LSL, WL and USL that are alternately stacked on the semiconductor substrate 100. Specifically, the supporters SP may be formed in a pillar shape to penetrate the gate electrodes LSL, WL and USL and the interlayer dielectrics 110. The supporters SP may be formed of dielectric material, so that they may be electrically connected to the interlayer dielectrics 110 between the gate electrodes LSL, WL and USL. In the first exemplary embodiment of the inventive concept, the supporters SP may penetrate the gate electrodes LSL and WL (i.e., all but the uppermost gate electrode USL). Also, in the first exemplary embodiment of the inventive concept, the supporters SP may have the same length. The supporters SP of the same length may be formed in the edge portion of the memory cell region MR. That is, the supporters SP may be formed in corner portion of the memory cell region MR. As well as in the corner portion of the memory cell region MS, the supporters SP may be formed in certain regions of the edge portions of the gate electrodes LSL, WL and USL in such a way that they are spaced apart from each other.

Referring to FIGS. 2B, 2C and 3, the supporters SP according to the first exemplary embodiment of the inventive concept may have various shapes instead of the shape of a cylindrical pillar.

That is, as illustrated in FIG. 2B, supporters SF may be pillars that are line-shaped in the plan view. The line-shaped supporters SF are disposed in the contact region MR of the gate electrodes LSL, WL and USL, and are formed around the memory cell region MR. The line-shaped supporters SF are spaced apart from each other, and may have the same length or different lengths.

Also, as illustrated in FIG. 2C, supporters SF' may have line patterns that are connected to each other and extend in different directions on the plane. The supporters SF' may be formed to surround the corner portions of the memory cell region MR as illustrated in FIG. 2C.

Hereinafter, a nonvolatile memory device according to a second exemplary embodiment of the inventive concept will be described with reference to FIGS. 4 and 5. In describing the second exemplary embodiment, detailed description of elements of the first exemplary embodiment will not be repeated.

Figure 4:
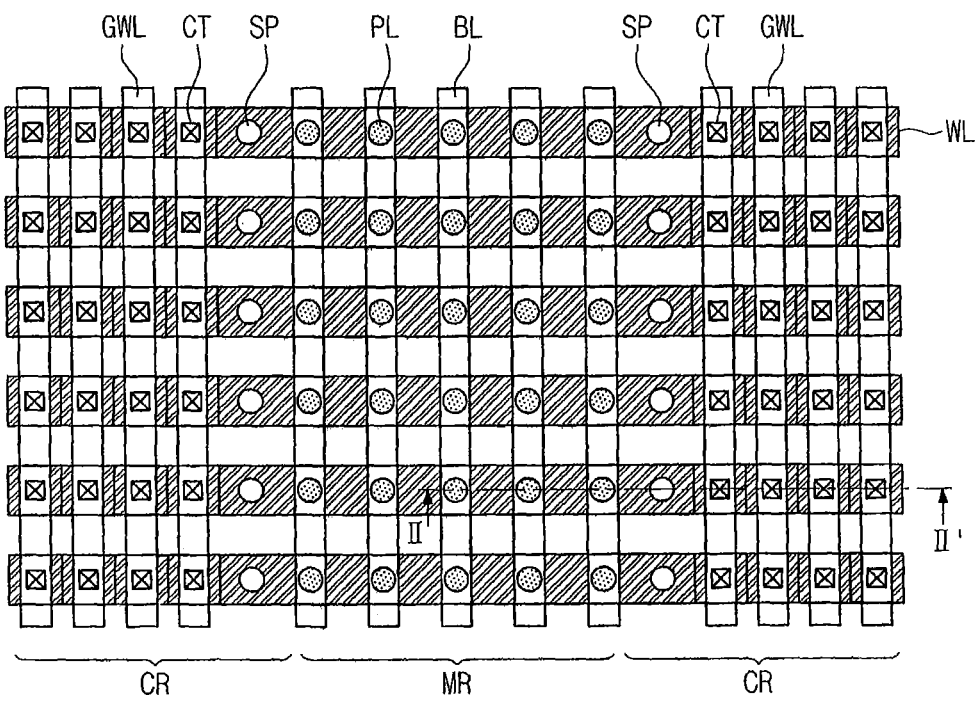
FIG. 4 is a plan view of a nonvolatile memory device according to a second exemplary embodiment of the inventive concept.

FIG. 4 is a plan view of a nonvolatile memory device according to a second exemplary embodiment of the inventive concept. FIG. 5 is a sectional view of the nonvolatile memory device according to the second exemplary embodiment of the inventive concept, which is taken along a line II-II' of FIG. 4.

Figure 5:
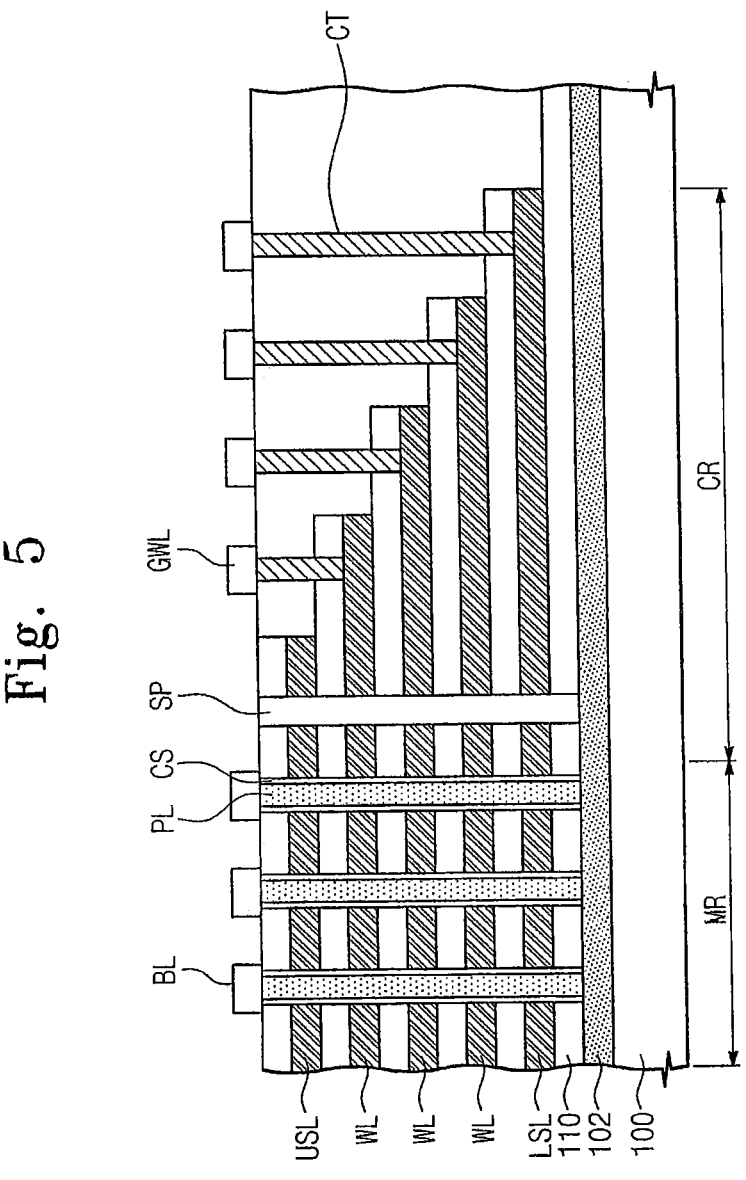
FIG. 5 is a sectional view of the nonvolatile memory device according to the second exemplary embodiment of the inventive concept, which is taken along a line II-II' of FIG. 4.

Referring to FIGS. 4 and 5, in a nonvolatile memory device according to a second exemplary embodiment of the inventive concept, gate electrodes LSL, WL and USL have the shape of a line that extends from a memory cell region MR to a contact region CR. That is, the memory cell region MR corresponds to a central portion of the line-shaped gate electrodes LSL, WL and USL, and the contact region CR corresponds to one or both end portions of the line-shaped gate electrodes LSL, WL and USL. In the description of the second exemplary embodiment of the inventive concept, the contact region CR corresponds to both edge portions of the memory cell region MR.

All of the line-shaped gate electrodes LSL, WL and USL of the memory cell region MR and the contact region CR may be formed of the same material. Alternatively, the gate electrodes LSL, WL and USL of the memory cell region MR and the gate electrodes LSL, WL and USL of the contact region CR may be formed of different conductive materials, as in the first exemplary embodiment. That is, all of the gate electrodes LSL, WL and USL of the memory cell region MR and the contact region CR may comprise metal material. Alternatively, the gate electrodes LSL, WL and USL of the memory cell region MR may be formed of polysilicon, and the gate electrodes LSL, WL and USL of the contact region CR may comprise metal material.

Active pillars PL penetrate the gate electrodes LSL, WL and USL stacked in the memory cell region MR, and supporters SP penetrate the gate electrodes LSL, WL and USL stacked in the contact region CR.

The active pillars PL are formed of semiconductor material, and are connected to a semiconductor substrate 100 by penetrating the stacked gate electrodes LSL, WL and USL. A charge storage layer CS is formed around each of the active pillars PL, and bit lines intersecting the gate electrodes LSL, WL and USL are electrically connected on the active pillars PL.

The supporters SP may be pillars formed of dielectric material, and may be formed in both end portions of the gate electrodes LSL, WL and USL (i.e., the contact region CR) in such a way that they are spaced apart from the active pillars PL. Specifically, in the second exemplary embodiment of the inventive concept, the supporters SP may be formed on one side of the active pillars PL located at the edge portion of the memory region MR, and may penetrate all of the stacked gate electrodes LSL, WL and USL. Also, the gate electrodes LSL, WL and USL of the contact region CR may be electrically connected to global word lines GWL through contacts CT.

The active pillars PL of the nonvolatile memory device according to the second exemplary embodiment of the inventive concept may be formed on one sidewall of the gate electrodes LSL, WL and USL as illustrated in FIG. 7.

FIG. 6 is a plan view of a nonvolatile memory device according to n third exemplary embodiment of the inventive concept. FIG. 7 is a sectional view of the nonvolatile memory device according to the third exemplary embodiment of the inventive concept, which is taken along lines A-A' and B-B' of FIG. 6.

Referring to FIGS. 6 and 7, line-shaped gate electrodes (WL, 250) are stacked, and bit lines (BL, 270) intersecting the gate electrodes (WL, 250) may be disposed on the stacked gate electrodes (WL, 250). Active pillars (PL', 224) may be formed perpendicularly to a semiconductor substrate 200 and intersect one sidewall of the stacked gate electrodes (WL, 250). In the third exemplary embodiment, instead of being a cylindrical shape, the active pillars (PL', 224) may be a structure that is formed by patterning on one sidewall of the stacked gate electrodes (WL, 250). That is, the active pillars (PL', 224) may be disposed on one sidewall of the stacked gate electrodes (WL, 250) in such a way that they are spaced apart from each other. The active pillars (PL', 224) formed on one sidewall of the stacked gate electrodes (WL, 250) may be formed to face the active pillars (PL', 224) intersecting one sidewall of the adjacent gate electrodes (WL, 250). Also, a charge storage layer 245 is disposed between the top and bottom surfaces of the gate electrodes (WL, 250) and one sidewall contacting the active pillars (PL', 224).

Also, as in the second exemplary embodiment, supporters SP supporting the gate electrodes (WL, 250) are formed in the contact region CR. The supporters SP may be circular pillars formed of dielectric material, and may penetrate all of the stacked gate electrodes (WL, 250). Also, the gate electrodes (WL, 250) of the contact region CR may be electrically connected to global word lines GWL through contacts CT.

Hereinafter, nonvolatile memory devices according to exemplary embodiments 4 to 6 of the inventive concept will be described in detail.

FIG. 8 is a plan view of a nonvolatile memory device according to a fourth exemplary embodiment of the inventive concept. FIG. 9 is a sectional view of the nonvolatile memory device according to the fourth exemplary embodiment of the inventive concept, which is taken along a line I-I' of FIG. 8. In describing the fourth exemplary embodiment, detailed description of elements of other exemplary embodiments will not be repeated.

Referring to FIGS. 8 and 9, plate-shaped gate electrodes LSL, WL and USL are formed on a semiconductor substrate 100, with interlayer dielectrics 110 disposed therebetween. The plate-shaped gate electrodes LSL, WL and USL are formed over a memory cell region MR and contact regions CR around the memory cell region MR. The stacked gate electrodes LSL, WL and USL in the contact region CR may have a stair shape. That is, the upper gate electrode is formed to expose the lower gate electrode. Because the gate electrodes LSL, WL and USL are stacked in a stair shape, the interlayer dielectrics between the gate electrodes LSL, WL and USL may have a stair-shaped stack structure.

Active pillars PL penetrate the gate electrodes LSL, WL and USL of the memory cell region MR. Supporters SP of different lengths may be formed at the gate electrodes LSL, WL and USL of the contract region CR. The supporters SP are formed between the interlayer dielectrics 110 spaced apart from each other, and penetrate the gate electrodes LSL, WL and USL between the interlayer dielectrics 110.

The supporters SP of different lengths may be formed at each edge portion of the plate-shaped gate electrodes LSL, WL and USL of each layer. The lengths of the adjacent supporters SP may decrease with an increase in the distance from the memory cell region MR. The number of the gate electrodes LSL, WL and USL penetrating the supporters SP differs because the supporters SP are formed to different heights. Therefore, the supporters SP may penetrate all or some of the gate electrodes LSL, WL and USL. Also, the interface between the upper and lower gate electrodes may be formed between the adjacent supporters SP. Also, the supporters SP formed to different lengths in the contact region CR may be formed between the sidewalls of the vertically-adjacent gate electrodes gate electrodes LSL, WL and USL.

FIG. 10 is a plan view of a nonvolatile memory device according to a fifth exemplary embodiment of the inventive concept. FIG. 11 is a sectional view of the nonvolatile memory device according to the fifth exemplary embodiment of the inventive concept, which is taken along a line II-II' of FIG. 10.

Referring to FIGS. 10 and 11, gate electrodes LSL, WL and USL are formed in a line shape, and active pillars PL penetrate the gate electrodes LSL, WL and USL of a memory cell region MR. Also, supporters SP of different lengths penetrate the gate electrodes LSL, WL and USL of a contact region CR. That is, the supporters SP are located at both end portions of the gate electrodes LSL, WL and USL. The supporters SP may be formed in plurality on the same line as the active pillars PL, and the supporters SP on the same line are spaced apart from each other. The supporters SP adjacent to the active pillars PL may penetrate all of the stacked gate electrodes LSL, WL and USL. Also, the number of the interlayer dielectrics 110 and the stacked gate electrodes LSL, WL and USL penetrated the supporters SP may decrease with an increase in the distance of the supporters SP from the memory cell region MR.

FIG. 12 is a plan view of a nonvolatile memory device according to a sixth exemplary embodiment of the inventive concept.

Referring to FIG. 12, active pillars PL' may be formed across stacked gate electrodes LSL, WL and USL. A charge storage layer CS is formed between the active pillars PL' and the gate electrodes LSL, WL and USL. Also, as in the embodiment of FIGS. 6 and 7, supporters SP of different lengths penetrate the gate electrodes LSL, WL and USL of a contact region CR.

Although it has been described in the first to sixth exemplary embodiments that the supporters SP formed at the gate electrodes LSL, WL and USL of the contact region CR are pillars formed of dielectric material, the supporters SP may have the same structure as the active pillars PL. That is, the supporters SP of the contact region CR may also be formed of semiconductor material, and the charge storage layer CS surrounding the supporters SP may be formed between the supporters SP and the gate electrodes LSL, WL and USL. In this embodiment, because the supporters SP of the contact region CR are not connected to the bit lines BL, they do not affect the operation of the nonvolatile memory device.

Hereinafter, methods for fabricating nonvolatile memory devices according to exemplary embodiments of the inventive concept will be described in detail.

A method for fabricating the nonvolatile memory devices according to the first and fourth exemplary embodiments of the inventive concept will be described below in detail with reference to FIGS. 13A to 13G.

FIGS. 13A to 13G are sectional views illustrating a method for fabricating the nonvolatile memory devices according to the first and fourth exemplary embodiments of the inventive concept. In the method for fabricating the nonvolatile memory devices according to the first and fourth exemplary embodiments, the planar structure will be described with reference to FIG. 2A.

Figure 13A:
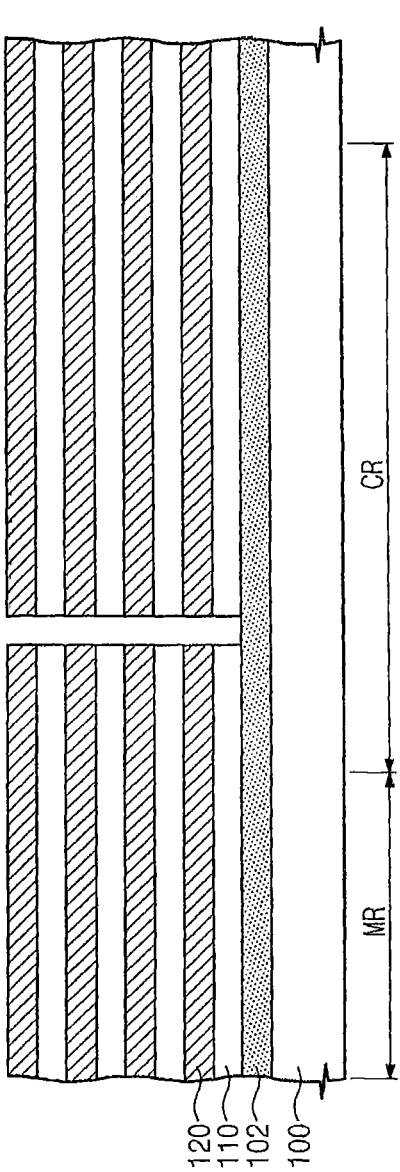

Referring to FIG. 13A, interlayer dielectrics 110 and conductive layers 120 are alternately stacked on a semiconductor substrate 100. The semiconductor substrate 100 includes a memory cell region MR and a contact region CR around the memory cell region MR. In the exemplary embodiments of the inventive concept, the memory cell region MR and the contact region CR are regions for gate electrodes. Also, the semiconductor substrate 100 may include an impurity region (or well) 102, and the interlayer dielectrics 110 and the conductive layers 120 are formed over the semiconductor substrate 100. The interlayer dielectrics 110 may be formed of silicon oxide, silicon oxynitride, or silicon nitride, and the conductive layers 120 may be formed of polysilicon. The number of the stacked conductive layers 120 may depend on the capacity of the nonvolatile memory device.

After the interlayer dielectrics 110 and the conductive layers 120 are stacked over the semiconductor substrate 100, dummy holes for supporters 130 may be formed around a region for memory cells. For example, a photolithography process is performed on the stacked interlayer dielectrics 110 and conductive layers 120 to form dummy holes in the contact region CR. The dummy holes may penetrate the interlayer dielectrics 110 and the conductive layers 120 to expose the semiconductor substrate 100.

The dummy holes may be formed around the memory cell region MR. Specifically, the dummy holes may be formed at the corner portions of the contact region CR as illustrated in FIG. 2. The planar structure of the dummy holes formed at the corner portions of the contact region CR may vary as illustrated in FIGS. 2A to 2C.

Also, the dummy holes may be formed in plurality at each of the corner portions of the contact region CR as illustrated in FIG. 8. The dummy holes increase in the distance from the memory cell region MR. Also, the positions of the dummy holes may be the interface between upper and lower gate electrodes that will be formed through the subsequent process.

Figure 13B:
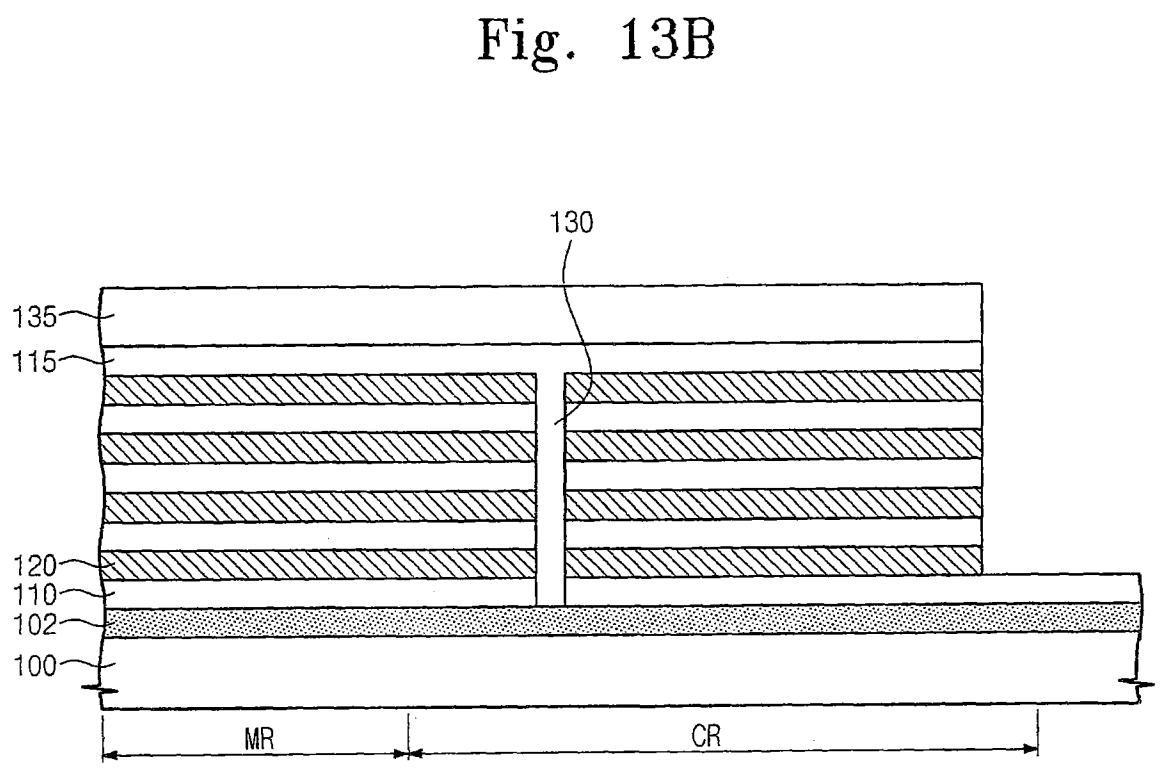

Referring to FIG. 13B, the dummy holes are filled with dielectric material to form supporters 130. The supporters 130 may be formed of the same material as the interlayer dielectrics 110. Also, a dielectric layer 115 may be formed up to on the uppermost layer when the supporters 130 are formed. The formed supporters 130 penetrate the stacked interlayer dielectrics 120 and conductive layers 120 to contact the semiconductor substrate 100.

Thereafter, a plate-shaped interlayer dielectric 110 and a conductive layer 120 are formed across the memory cell region MR and the contact region CR. That is, the stacked interlayer dielectrics 110 and conductive layers 120 may be patterned to form square-shaped gate electrodes across the memory cell region MR and the contact region CR. That is, the stacked interlayer dielectrics 110 and conductive layers 120 may be patterned to form a square-shaped stack structure in the memory cell region MR and the contact region CR of the semiconductor substrate 100. In the exemplary embodiments of the inventive concept, the stack structure means a structure where the interlayer dielectrics 110 and the conductive layers 120 are alternately stacked. When the square-shaped stack structure is formed, the sidewalls of the stacked interlayer dielectrics 110 and conductive layers 120 may be exposed. Alternatively, the forming of the square-shaped stack structure may be performed before the forming of the supporters 130.

Figure 13C:
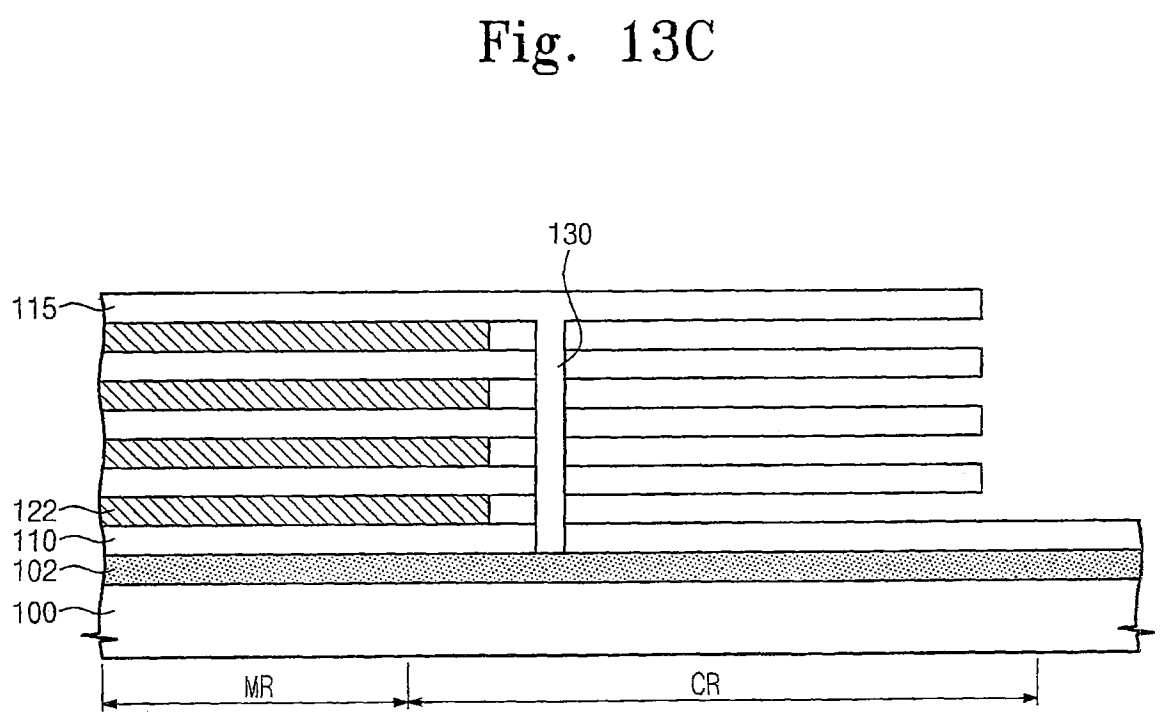

Referring to FIG. 13C, an etchant having a high etch selectivity with respect to the conductive layers 120 is supplied to the sidewall of the square-shaped stack structure to remove portions of the conductive layers 120. The etchant infiltrates from the edge to the center of the stack structure to selectively etch the conductive layers 120. Because the supporters 130 are spaced apart from each other in the contact region CR, the conductive layers 120 may be removed up to the inside of the supporters 130. That is, through a wet etch process, the conductive layers 120 may remain only in the memory cell region MR, and the interlayer dielectrics 110 and the supporters 130 penetrating the interlayer dielectrics 110 remain in the contact region CR. The conditions for the wet etch process, such as the supply time of the etchant, the concentration of the etchant and the supply rate of the etchant, may be controlled to remove the conductive layers 120 of the contact region CR. In this manner, after the wet etch process, the remaining conductive layers 122 may define the memory cell region MR of the gate electrodes.

During the removing of the conductive layers 120 of the contact region CR through the wet etch process, a capillary force may be generated at the interlayer dielectrics 110 due to the empty space between the interlayer dielectrics 110. Accordingly, the upper and lower interlayer dielectrics 110 may tend to bond together. Therefore, when an etchant is continuously supplied between the interlayer dielectrics 110, the interlayer dielectrics 110 may collapse. However, in the exemplary embodiments of the inventive concept, the supporters 130 of the contact region CR are formed perpendicularly to the interlayer dielectrics 110, thus making it possible to prevent the upper and lower interlayer dielectrics 110 from collapsing or bonding together. That is, when the conductive layers 120 of the contact region CR are removed, the supporters 130 may serve to maintain the spacing distance between the stacked interlayer dielectrics 110.

That is, during the removing of the conductive layers 120 of the contact region CR, the interlayer dielectrics 110, which are parallel to the semiconductor substrate 100 and spaced apart from each other, and the supporters 130, which are perpendicular to the semiconductor substrate 100, remain in the contact region CR. That is, in the contact region CR, an empty space is formed between the interlayer dielectrics 110, and the supporters 130 support the interlayer dielectrics 110 that are spaced apart from each other.

Figure 13D:
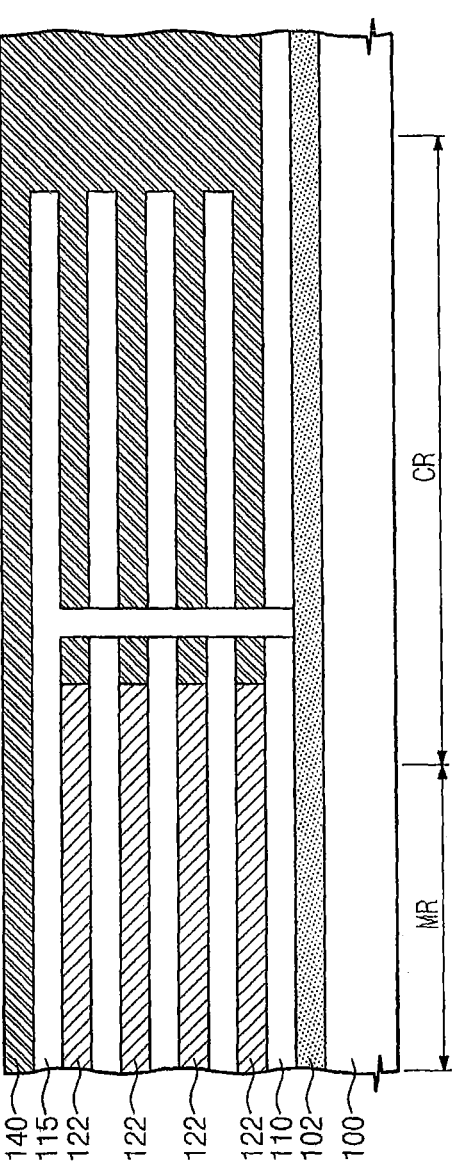

Referring to FIG. 13D, a metal layer 140 is deposited on the entire surface of the stack structure from which the conductive layers 120 of the contact region CR have been removed. That is, the metal layer 140 may fill the space between the interlayer dielectrics 110 of the contact region CR, and may also be deposited on the top surface of the stack structure and the semiconductor substrate 100 around the stack structure. The metal layer 140, filling the space between the interlayer dielectrics 110 of the contact region CR, may contact the conductive layers 120 of the memory cell region MR. The metal layer 140 may be formed of one of metal materials such as W, Al, Cu, Pt, Ru and Ir, conductive metal nitrides such as TiN, TaN and WN, conductive metal oxides such as $RuO_2$ and $IrO_2$, and a combination thereof.

Figure 13E:
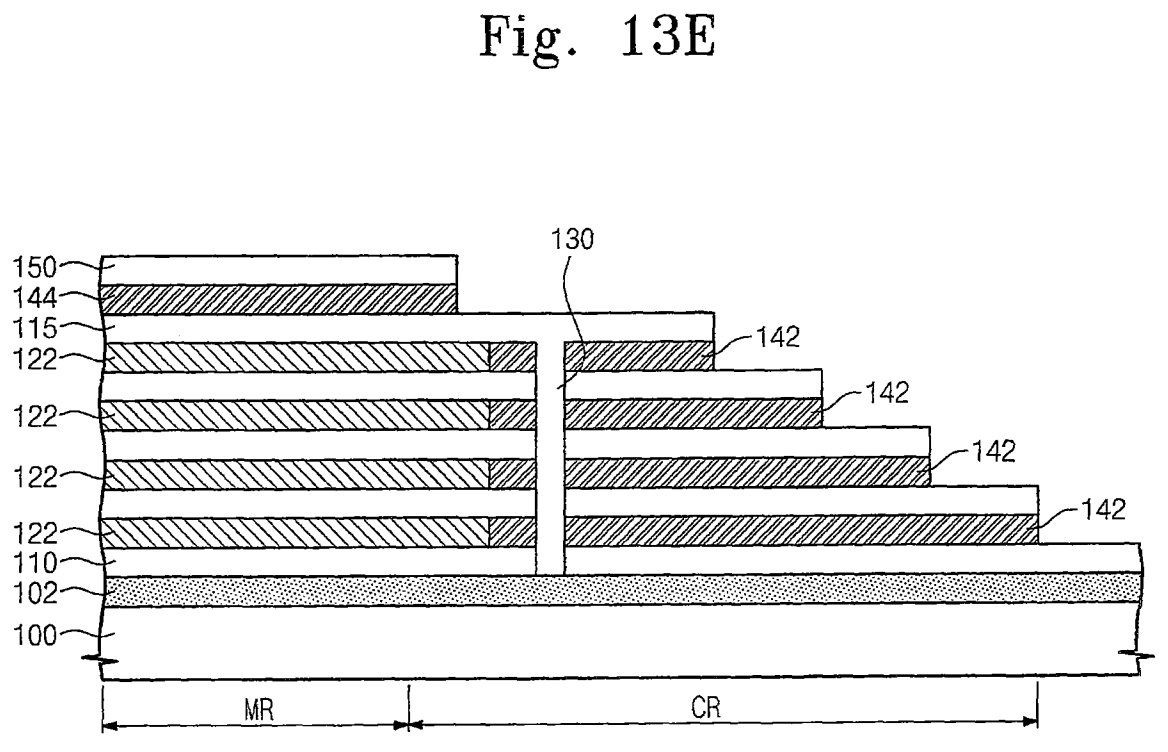

Referring to FIG. 13E, the metal layer 140 covering the stack structure is patterned to form stair-shaped metal layer patterns 142 in the contact region CR. When the metal layer 140 is formed also on the top surface of the stack structure, the uppermost metal layer 140 may be covered by a dielectric layer 150. Accordingly, the areas of the metal layer patterns 142 may decrease with an increase in the distance from the semiconductor substrate 100. That is, when the metal layer 140 is patterned in a stair shape, gate electrodes 122 and 142 may be formed to have a plate shape and decrease in area with an increase in the height from the semiconductor substrate 100. Also, the gate electrodes 122 and 142 may have the memory cell region MR including the conductive layers 122, and the contact region CR including the metal layers 142.

When the metal layer patterns 142 are formed in the contact region CR, the metal layer 140 deposited on the uppermost dielectric layer 115 may be patterned in separate line patterns 144. That is, line-shaped gate electrodes 144 may be formed on the uppermost dielectric layer 115. In the memory cell region MR and the contact region CR, the uppermost gate electrodes 144 may comprise metal material. The line-shaped gate electrodes 144 formed on the stack structure are used as the upper select lines (USL1~USL3 of FIG. 1) in the exemplary embodiments of the inventive concept. Also, because the uppermost gate electrodes 144 are formed after the forming of the supporters 130, the supporters 130 do not penetrate the uppermost gate electrodes 144.

Also, as illustrated in FIG. 8, when a plurality of the supporters SP are formed in the contact region CR, the supporters 130 adjacent to each other may also be etched in a stair shape during the forming of the stair-shaped metal layer patterns 142.

Figure 13F:
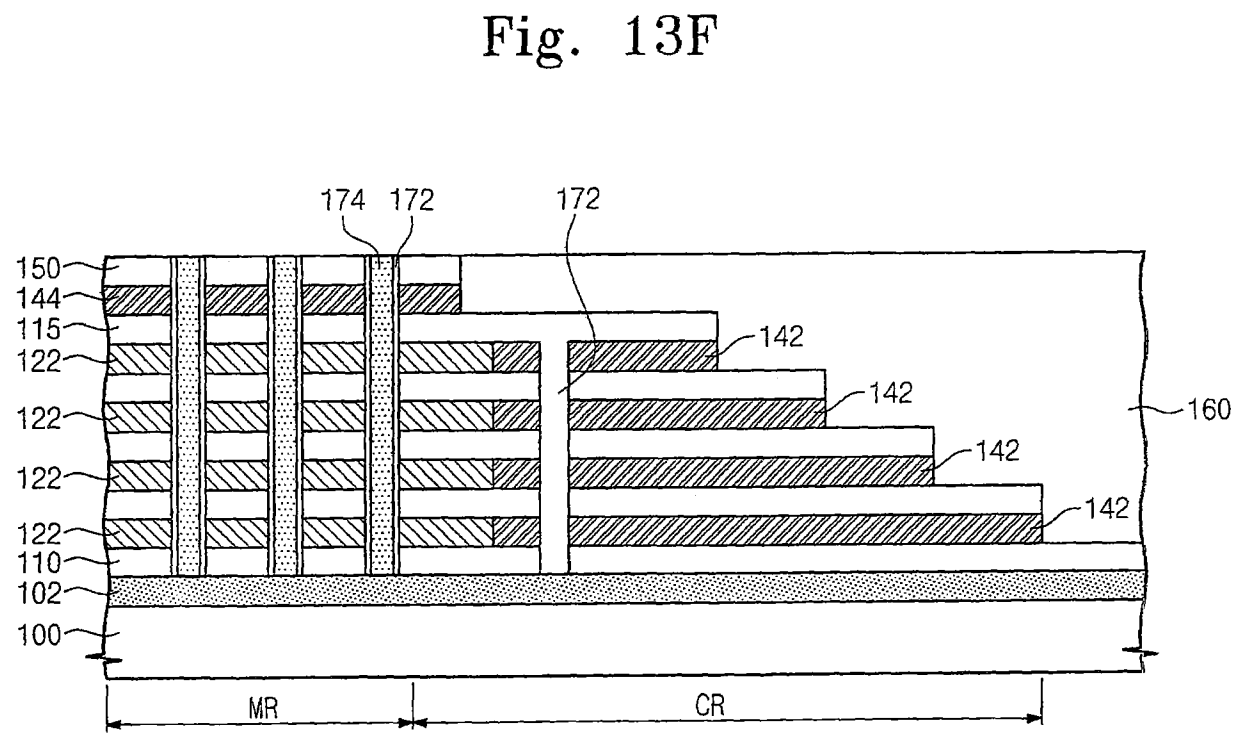

Referring to FIG. 13F, after the forming of the gate electrodes on the semiconductor substrate 100, a dielectric layer 160 may be formed to fully cover the stacked gate electrodes. Active pillars 174 penetrating the stacked gate electrodes, and a charge storage layer 172 surrounding the active layers 174, may be formed in the memory cell region MR. Specifically, a plurality of channel holes are formed to penetrate the interlayer dielectrics 110 and the conductive layers 122 stacked in the memory cell region MR. The channel holes may be formed by forming a mask pattern (not illustrated) on the uppermost dielectric layer 150 and selectively and anisotropically etching the stacked interlayer dielectrics 110 and conductive layers 122 by means of the mask pattern. The formed channel holes may expose the impurity region 102 of the semiconductor substrate 100. Also, the channel holes may be formed in a matrix configuration on the plane.

Thereafter, a charge storage layer 172 is deposited conformally along the surface of the channel holes. That is, the charge storage layer 172 may be formed on the sidewalls of the conductive layers 122 and the interlayer dielectrics 110 exposed by the channel holes. In an exemplary embodiment, the charge storage layer 172 may be formed by sequentially depositing a charge tunneling layer, a charge trapping layer, and a charge blocking layer. That is, an oxide layer, a nitride layer, and an oxide layer may be sequentially formed on the surface of the channel holes.

The channel holes including the charge storage layer 172 is filled with semiconductor material to form active pillars 174. The filling of the channel holes with semiconductor material may include: performing an epitaxial process using the semiconductor substrate 100 as a seed layer; or depositing semiconductor material. The semiconductor material may be monocrystalline or polycrystalline semiconductor material. Thereafter, the semiconductor material filling the channel holes may be planarized to expose the top surface of the uppermost dielectric layer 150.

Figure 13G:
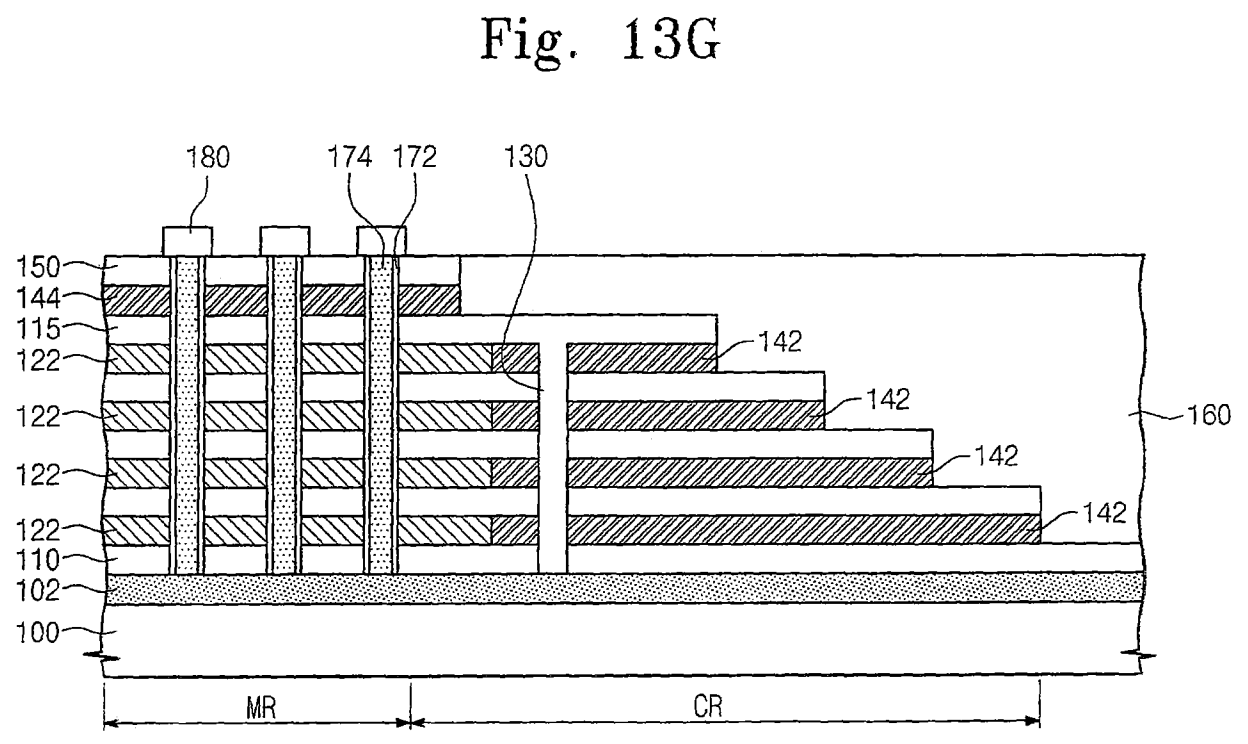

Referring to FIG. 13G, contacts (CT of FIG. 2A) may be formed to be connected respectively to the gate electrodes 142 of the contact region CR. Because the gate electrodes

142 of the contact region CR are formed in a stair shape, the contacts may differ in length.

After the forming of the contacts, bit lines 180 are formed to be connected to the active pillars 174. The bit lines 174 are formed across the uppermost gate electrodes 144. At the formation of the bit lines 180, global word lines (GWL of FIG. 2) connected to the gate electrodes 142 of each layer may be formed on the contacts.

A method for fabricating the nonvolatile memory devices according to the second and fifth exemplary embodiments of the inventive concept will be described in detail with reference to FIGS. 14A to 14F.

FIGS. 14A to 14F are sectional views illustrating a method for fabricating the nonvolatile memory devices according to the second and fifth exemplary embodiments of the inventive concept, which are taken along the line II-II' of FIG. 10.

Figure 14A:
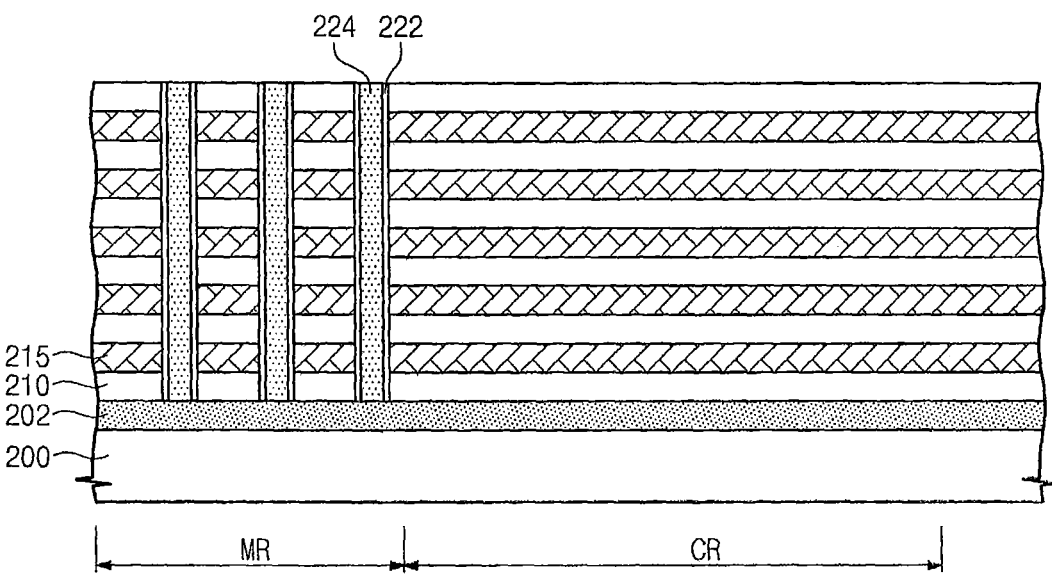

Referring to FIG. 14A, first and second dielectric layers 210 and 215 with different etch selectivity are alternately staked on a semiconductor substrate 200 including a memory cell region MR and a contact region CR. Specifically, the first and second dielectric layers 210 and 215 are formed of materials with different wet etch rates. For example, the first and second dielectric layers 210 and 215 may be formed of silicon oxide and silicon nitride, respectively.

Thereafter, active pillars 224 penetrating the first and second dielectric layers 210 and 215 and a charge storage layer 222 surrounding the active pillars 224 are formed in the memory cell region MR.

Specifically, a plurality of channel holes penetrating the stacked first and second dielectric layers 210 and 215 are formed in the memory cell region MR. The channel holes may be formed through a photolithography process. The channel holes may expose an impurity region 202 of the semiconductor substrate 200, and may be formed in a matrix configuration on the plane in the memory cell region MR. Thereafter, a charge storage layer 222 is formed conformally along the surface of the channel holes, and the deposited charge storage layer is anisotropically etched to leave the charge storage layer 222 only on the sidewalls of the first and second dielectric layers 210 and 215 and expose the surface of the semiconductor substrate 200. For example, the charge storage layer 222 may be formed by sequentially depositing a charge tunneling layer, a charge trapping layer, and a charge blocking layer. Thereafter, the channel holes are filled with semiconductor material to form active pillars 224. The semiconductor material may be monocrystalline or polycrystalline semiconductor material. Also, the forming of the active pillars 224 may include: performing an epitaxial process using the semiconductor substrate 200 as a seed layer; or depositing semiconductor material. Thereafter, the semiconductor material filling the channel holes may be planarized to expose the top surface of the uppermost first dielectric layer 210.

Figure 14B:
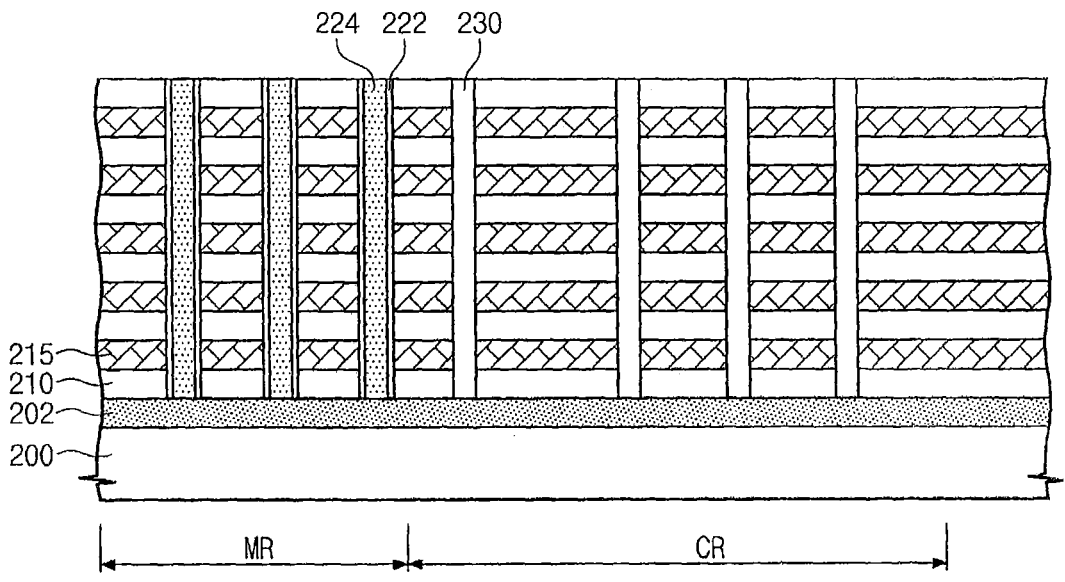

Referring to FIG. 14B, supporters 230 penetrating the first and second dielectric layers 210 and 215 are formed in the contact region CR. More specifically, a plurality of dummy holes for supporters 230 are formed around the memory cell region MR. The dummy holes may expose the surface of the semiconductor substrate 200. Thereafter, the dummy holes are filled with dielectric material, and the top portion is planarized to form pillar-shaped supporters 230.

Specifically, the supporters 230 may be formed on the same line as the active pillars 224 of the memory cell region MR, and may be symmetrically formed with the memory cell region MR therebetween. That is, the supporters 230 may be formed in one-to-one correspondence with each of both sides of the memory cell region MR as illustrated in FIG. 5, or may be formed in plurality at each of the both sides of the memory cell region MR as illustrated in FIG. 10. A plurality of the supporters 230 formed at both sides of the memory cell region MR may be spaced apart from each other by a predetermined distance.

Figure 14C:
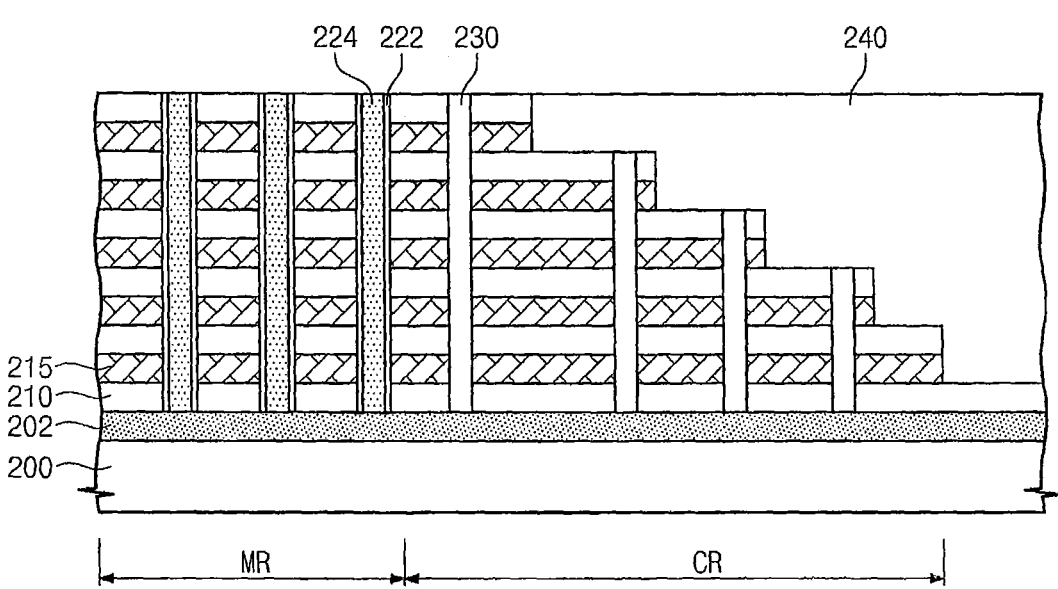

Referring to FIG. 14C, the first and second dielectric layers 210 and 215 of the contact region CR, with the supporters 230 formed therein, are patterned in a stair shape.

The heights of the first and second dielectric layers 210 and 215 decrease toward the edge of the contact region CR. The supporters 230 of the contact region CR may also be etched simultaneously with the patterning of the first and second dielectric layers 210 and 215 in a stair shape. That is, the supporter adjacent to the memory cell region MR penetrates all of the first and second dielectric layers 210 and 215, and the other supporters may be etched sequentially. Therefore, if a plurality of the supporters 230 are formed at both sides of the memory cell region MR, the lengths of the supporters 230 decrease toward the edge of the contact region CR.

On the other hand, if the supporters 230 are formed in one-to-one correspondence with each of both sides of the memory cell region MR, the supporters 230 are not etched during the patterning of the first and second dielectric layers 210 and 215 in a stair shape. That is, the supporters 230 may penetrate all of the first and second dielectric layers 210 and 215.

After the patterning of the first and second dielectric layers 210 and 215 of the contact region CR in a stair shape, a dielectric layer 240 may be formed on the stair-shaped first and second dielectric layers 210 and 215.

Thereafter, the first and second dielectric layers 210 and 215, stacked in a plate shape across the memory cell region MR and the contact region CR, are patterned to form line-shaped stack structures. The patterning of the first and second dielectric layers 210 and 215 in a line shape may be performed before the forming of the active pillars 224 or the supporters 230. The line-shaped stack structure may expose the sidewalls of the first and second dielectric layers 210 and 215, and may include the aligned active pillars 224 and supporters 230.

Figure 14D:
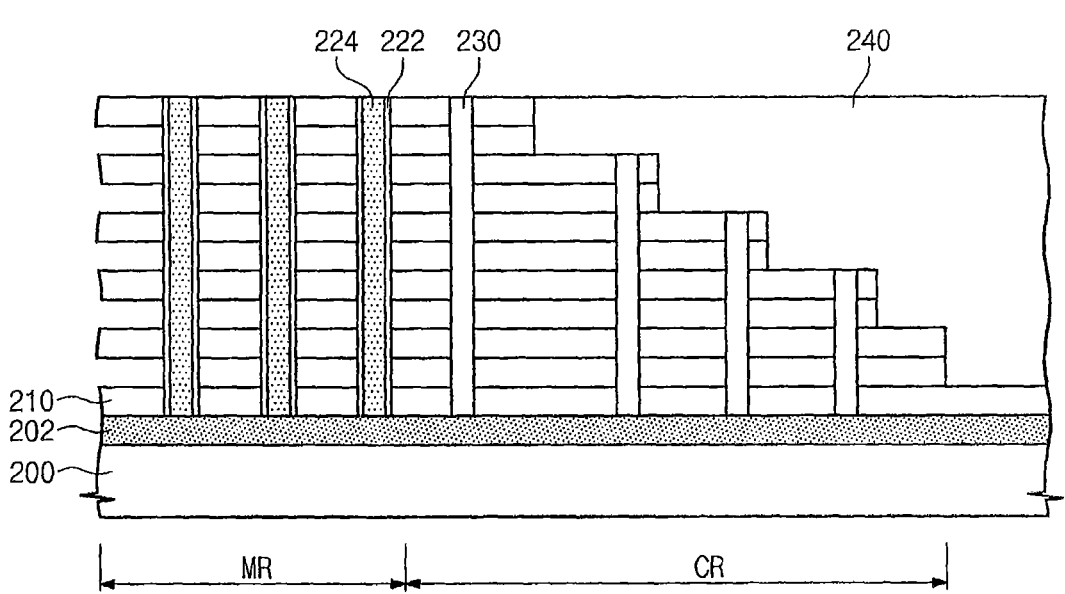

Referring to FIG. 14D, the second dielectric layers 215 formed between the first dielectric layers 210 are removed. Specifically, an etchant having a high etch selectivity with respect to the second dielectric layers 215 may be supplied to the semiconductor substrate 200 with the line-shaped stack structures to remove the second dielectric layers 215. Accordingly, an empty space is formed between the first dielectric layers 210, and the first dielectric layers 210 spaced apart from each other may be supported by the supporters 230 of the contact region CR and the active pillars 224 of the memory cell region MR.

Figure 14E:
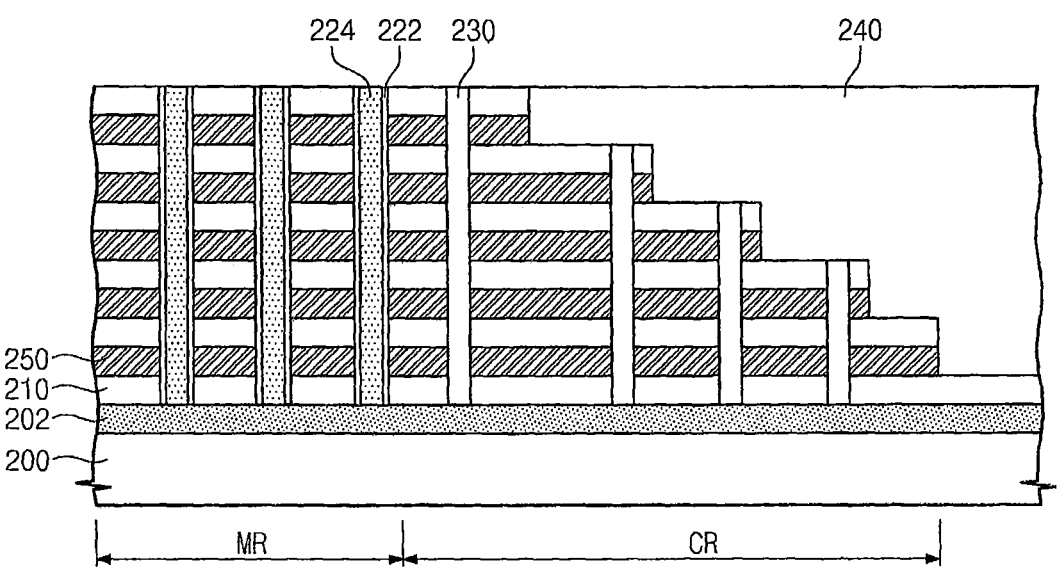

Referring to FIG. 14E, the space between the first dielectric layers 210 may be filled with conductive material to form line-shaped gate electrodes 250. Specifically, when conductive material is deposited between the first dielectric layers 210, a conductive layer 250 surrounding the supporters 230 and the active pillars 224 may be formed between the first dielectric layers 210. Thereafter, the conductive layer 250 filling the space between the adjacent line-shaped stack structures may be removed to form line-shaped gate electrodes 250. The conductive material may be polysilicon or metal material.

Figure 14F:
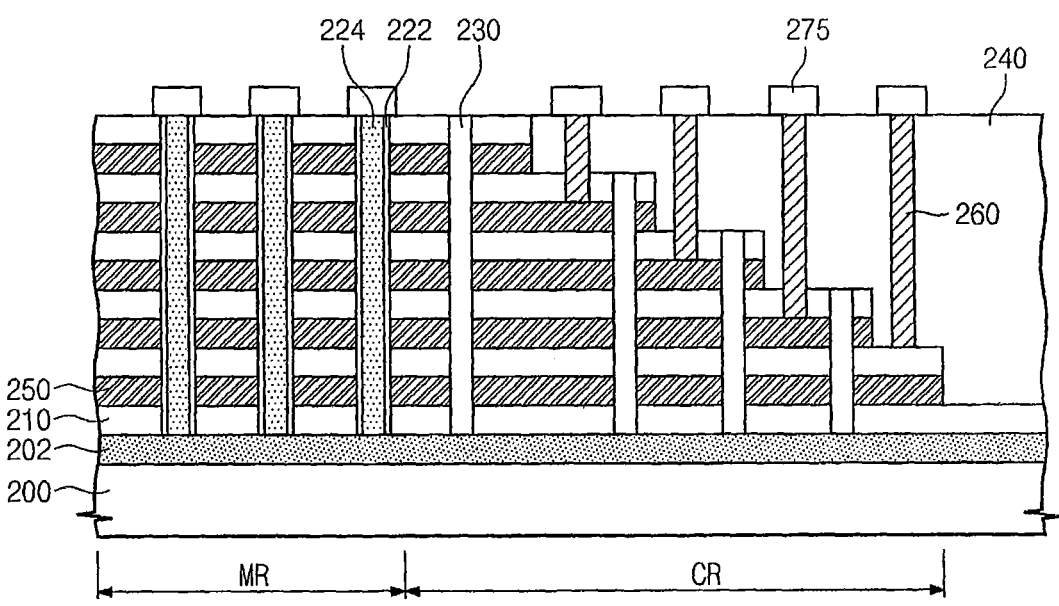

Referring to FIG. 14F, contact plugs 260, connected respectively to the gate electrodes 250 of each layer, are formed in the contact region CR of the gate electrodes 250. Because the gate electrodes 250 of the contact region CR are formed in a stair shape, the contact plugs 260 may differ in length.

Bit lines 270, which are electrically connected to the active pillars 224 and intersect the gate electrodes 250, are formed after the forming of the contact plugs 260. Also, global word lines 275 may be formed on the contact plugs 260.

Another method for fabricating the nonvolatile memory devices according to the second and fifth exemplary embodiments of the inventive concept will be described below with reference to FIGS. 15A to 15E.

FIGS. 15A to 15E are sectional views illustrating another method for fabricating the nonvolatile memory devices according to the second and fifth exemplary embodiments of the inventive concept, which are taken along the line II-II' of FIG. 10.

Figure 15A:
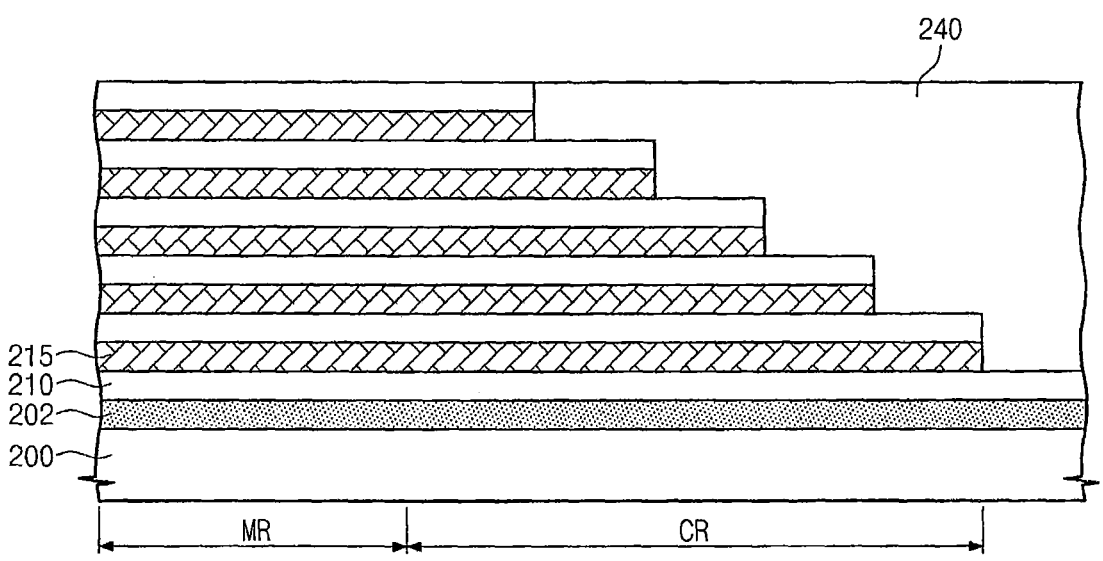

Referring to FIG. 15A, first and second dielectric layers 210 and 215 with different etch selectivity are alternately stacked on a semiconductor substrate 200, and a plate-shaped stack structure is formed across a memory cell region MR and a contact region CR. That is, the sidewalls of the stacked first and second dielectric layers 210 and 215 are aligned.

In the plate-shaped stack structure, the first and second dielectric layers 210 and 215 stacked on the contact region CR are patterned in a stair shape. That is, on the contact region CR, the stack height of the first and second dielectric layers 210 and 215 decreases toward the edge.

Thereafter, the plate-shaped stack structure is covered with a dielectric layer, and it is planarized to equalize the heights of the memory cell region MR and the contact region CR. That is, a dielectric layer 240 may be formed on the stair-shaped stack structure.

Figure 15B:
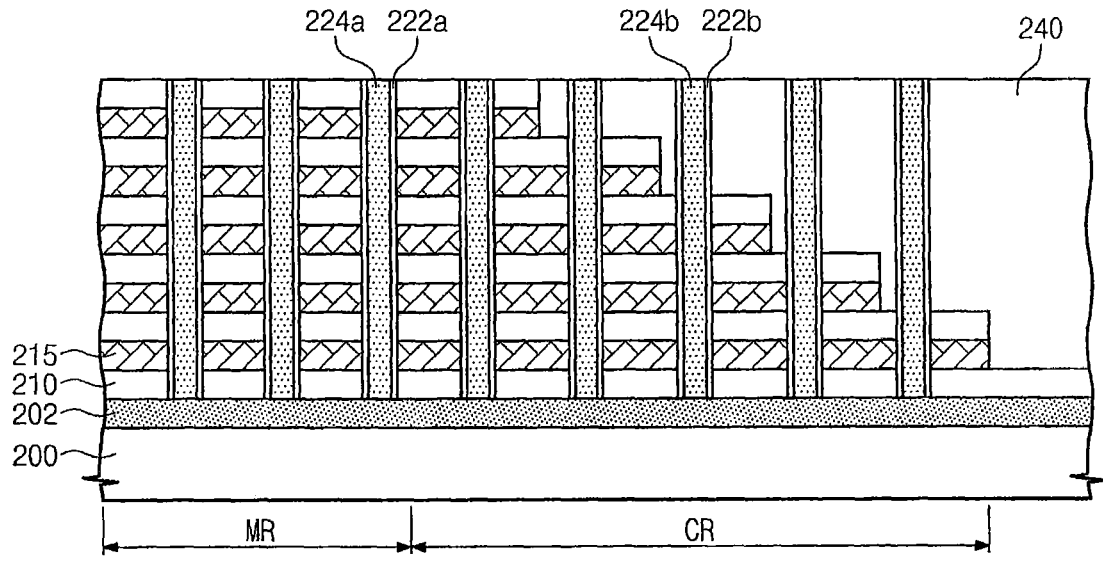

Referring to FIG. 15B, active pillars 224a are formed in the memory cell region MR and supporters 224b are formed in the contact region CR.

More specifically, channel holes are formed in the memory cell region MR and dummy holes are formed in the contact region CR. The channel holes and the dummy holes may be formed through a photolithography process, and the channel holes may be formed in a matrix configuration on the plane. Also, as illustrated in FIG. 5, the dummy holes may be formed respectively at one side of the channel holes located at the edge of the memory cell region MR. Also, as illustrated in FIG. 10, the dummy holes may be formed on the same line as the channel holes, and the dummy holes on the same line are spaced apart from each other. The dummy hole adjacent to the channel hole may penetrate all of the stacked first and second dielectric layers 210 and 215. Also, the number of the penetrated first and second dielectric layers 210 and 215 may decrease with an increase in the distance from the memory cell region MR.

Thereafter, charge storage layers 222a and 222b are formed at the sidewalls of the dummy holes and the channel holes, and the dummy holes and the channel holes are filled with semiconductor material to form active pillars 224a and supporters 224b. That is, charge storage layers 222a and 222b may be formed around the supporters 224b of the contact region CR and the active pillars 224a of the memory cell region MR. Also, the active pillars 224a and the supporters 224b may be formed to the same length. The active pillars 224a of the memory cell region MR may penetrate all of the stacked first and second dielectric layers 210 and 215, and the supporters 224b of the contact region CR may penetrate some of the stacked first and second dielectric layers 210 and 215.

Figure 15C:
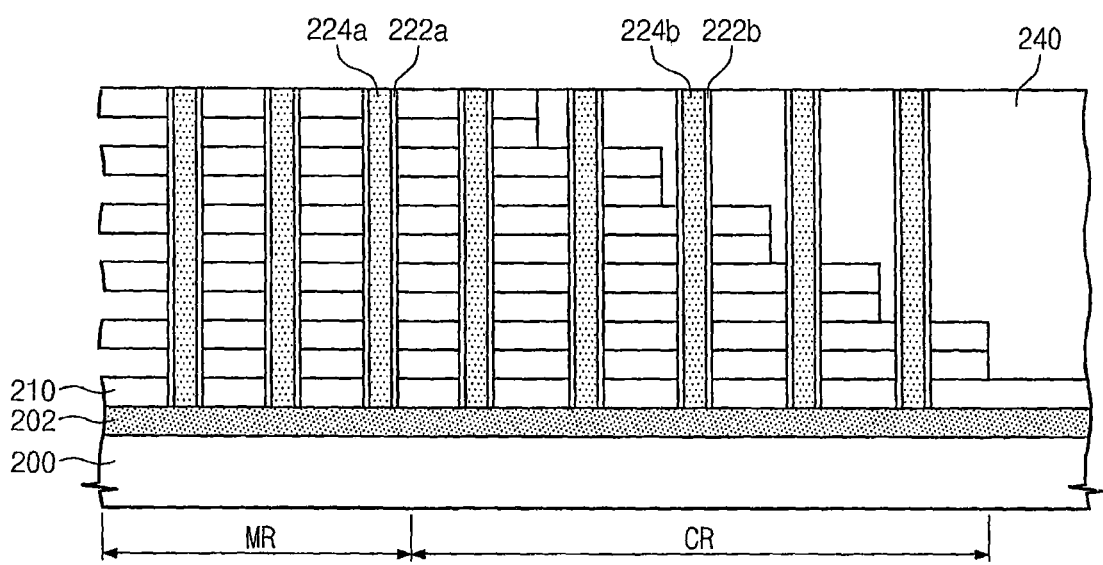

Referring to FIG. 15C, the plate-shaped stack structure including the active pillars 224a and the supporters 224b are patterned to form line-shaped stack structures. When the line-shaped stack structures are formed, the sidewalls of the first and second dielectric layers 210 and 215 may be exposed. Thereafter, an etchant having a high etch selectivity with respect to the first dielectric layer 210 are supplied between the line-shaped stack structures to remove the second dielectric layers 215. Accordingly, an empty space is formed between the first dielectric layers 210 that are perpendicular to the semiconductor substrate 200 and are spaced apart from each other. The first dielectric layers 210 spaced apart from each other may be supported by the active pillars 224a of the memory cell region MR, which are perpendicular to the semiconductor substrate 200, and the supporters 224b of the contact region CR. That is, the second dielectric layers 215 can be prevented from collapsing or getting near to each other during the removing of the second dielectric layers 215 through a wet etch process.

Figure 15D:
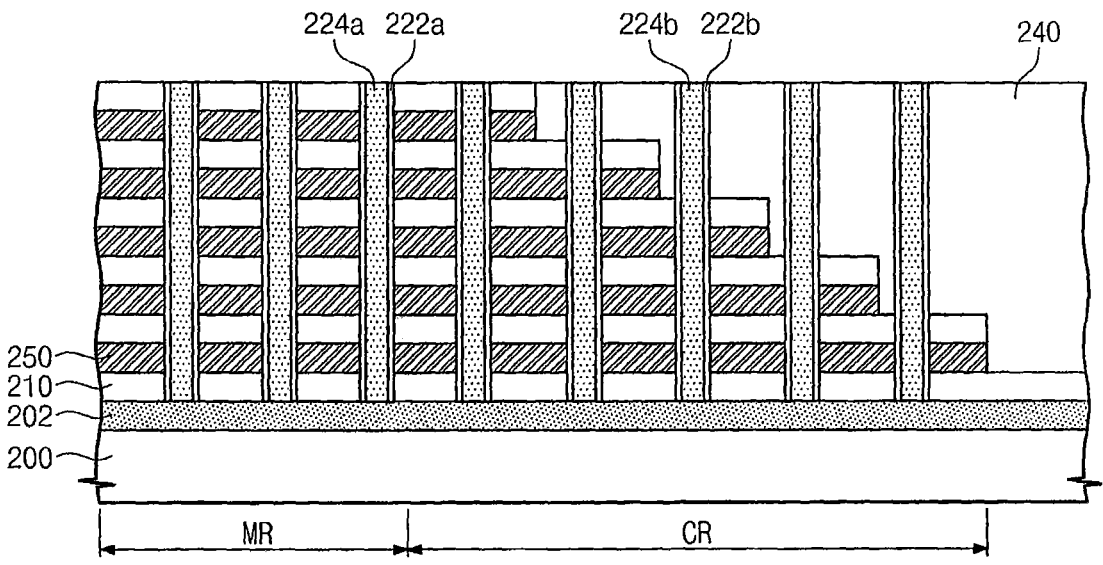

Referring to FIG. 15D, the space between the first dielectric layers 210 may be filled with conductive material to form line-shaped gate electrodes 250. Specifically, when conductive material is deposited between the first dielectric layers 210, conductive layers 250 may be formed around the active pillars 224a and the supporters 224b. Thereafter, the conductive layer 250 filling the space between the adjacent line-shaped stack structures may be removed to form line-shaped gate electrodes 250 between the first dielectric layers 210. The conductive material may be polysilicon or metal material.

Figure 15E:
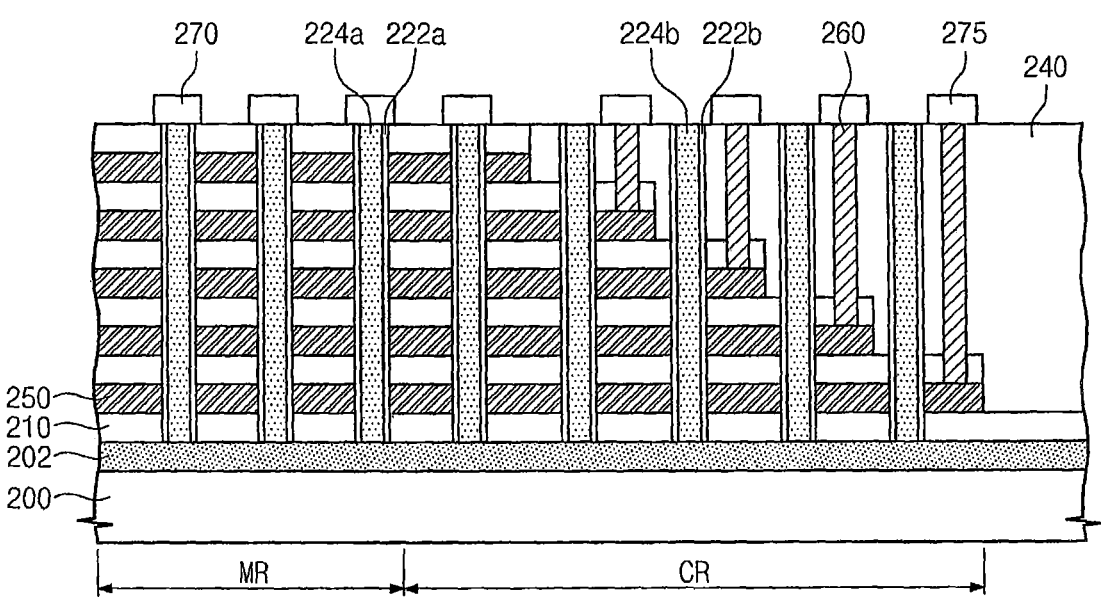

Referring to FIG. 15E, contact plugs 260, connected respectively to the gate electrodes 250 of each layer, are formed in the contact region CR of the gate electrodes 250. Because the gate electrodes 250 of the contact region CR are formed in a stair shape, the contact plugs 260 may differ in length.

Bit lines 270, which are electrically connected to the active pillars 224 and intersect the gate electrodes 250, are formed after the forming of the contact plugs 260. Also, global word lines 275 may be formed on the contact plugs 260.

Because a conductive pattern such as the global word line 275 or the bit line 270 is not formed on the supporters 224b, it does not affect the operation of the nonvolatile memory device according to the exemplary embodiment of the inventive concept.

A method for fabricating the nonvolatile memory devices according to the third and sixth exemplary embodiments of the inventive concept will be described below in brief with reference to FIGS. 16A to 16E.

With the exception of a method of forming the active pillars of the memory cell region, a method of forming the supporters of the contact region of the nonvolatile memory device according to the third and sixth exemplary embodiments may be identical to that of the second and fifth exemplary embodiments. Thus, the method of forming the active pillars of the memory cell region will be described in brief with reference to FIGS. 16A to 16E.

FIGS. 16A to 16E are sectional views illustrating a method for fabricating the nonvolatile memory devices according to the third and sixth exemplary embodiments of the inventive concept, which are taken along the lines A-A' and B-B' of FIG. 6.

Figure 16A:
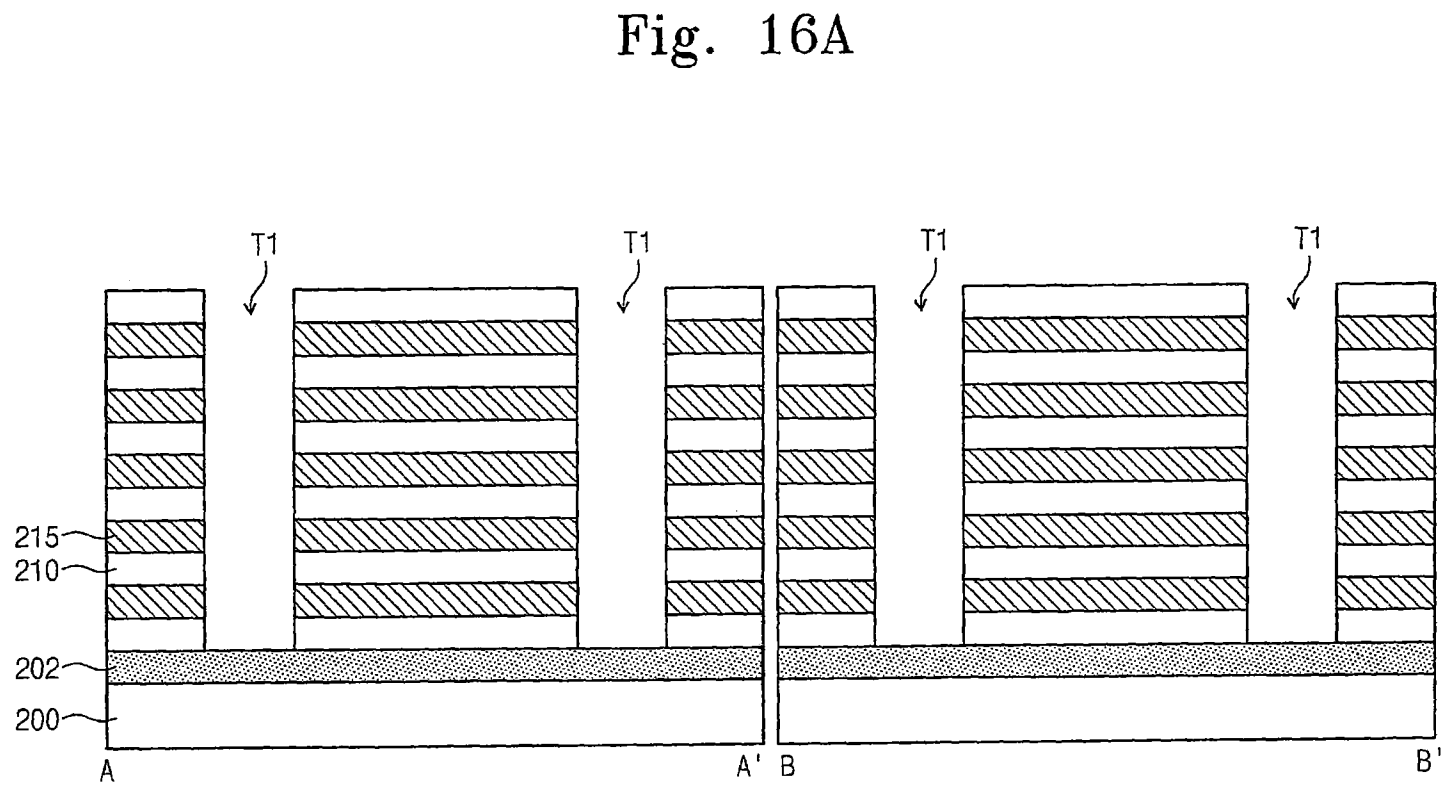

Referring to FIG. 16A, first and second dielectric layers 210 and 215 with different etch selectivity are alternately stacked on a semiconductor substrate 200. Line-shaped first trenches T1 exposing the semiconductor substrate 200 are formed in the stacked first and second dielectric layers 210 and 215. When the first trenches T1 are formed, the first sidewalls of the stacked first and second dielectric layers 210 and 215 may be exposed.

Figure 16B:
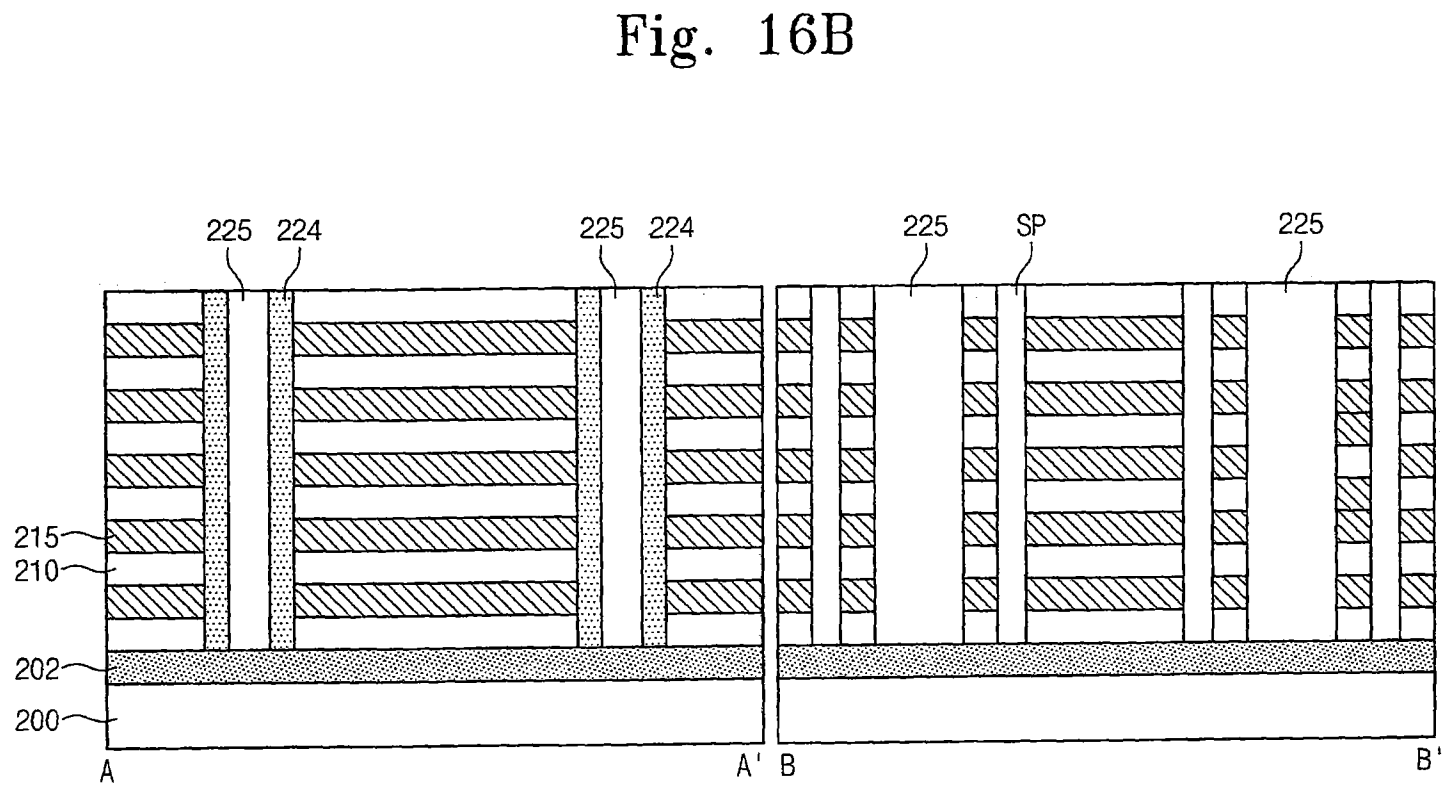

Referring to FIG. 16B, active pillars 224 are formed on the first sidewalls of the first and second dielectric layers 210 and 215 exposed by the first trenches T1. The active pillars 224 extend perpendicularly to the semiconductor substrate 200. Also, a semiconductor layer is formed conformally along the surfaces of the first trenches, and the semiconductor layer is anisotropically etched. Accordingly, the active pillars 224 may be formed to face each other. After the forming of the active pillars 224, the first trenches T1 are filled with dielectric material and it is planarized to form a dielectric layer 225 between the semiconductor layers.

After the forming of the dielectric layer 225, the semiconductor layer formed at the first sidewalls of the first and second dielectric layers 210 and 215 may be patterned. Accordingly, active pillars 224 spaced apart from each other may be formed on the first sidewalls of the first and second dielectric layers 210 and 215.

Thereafter, supporters SP penetrating the first and second dielectric layers 210 and 215 are formed in the contact region CR. The formation position and method of the supporters SP are substantially identical to those of the second and fourth exemplary embodiments.

Figure 16C:
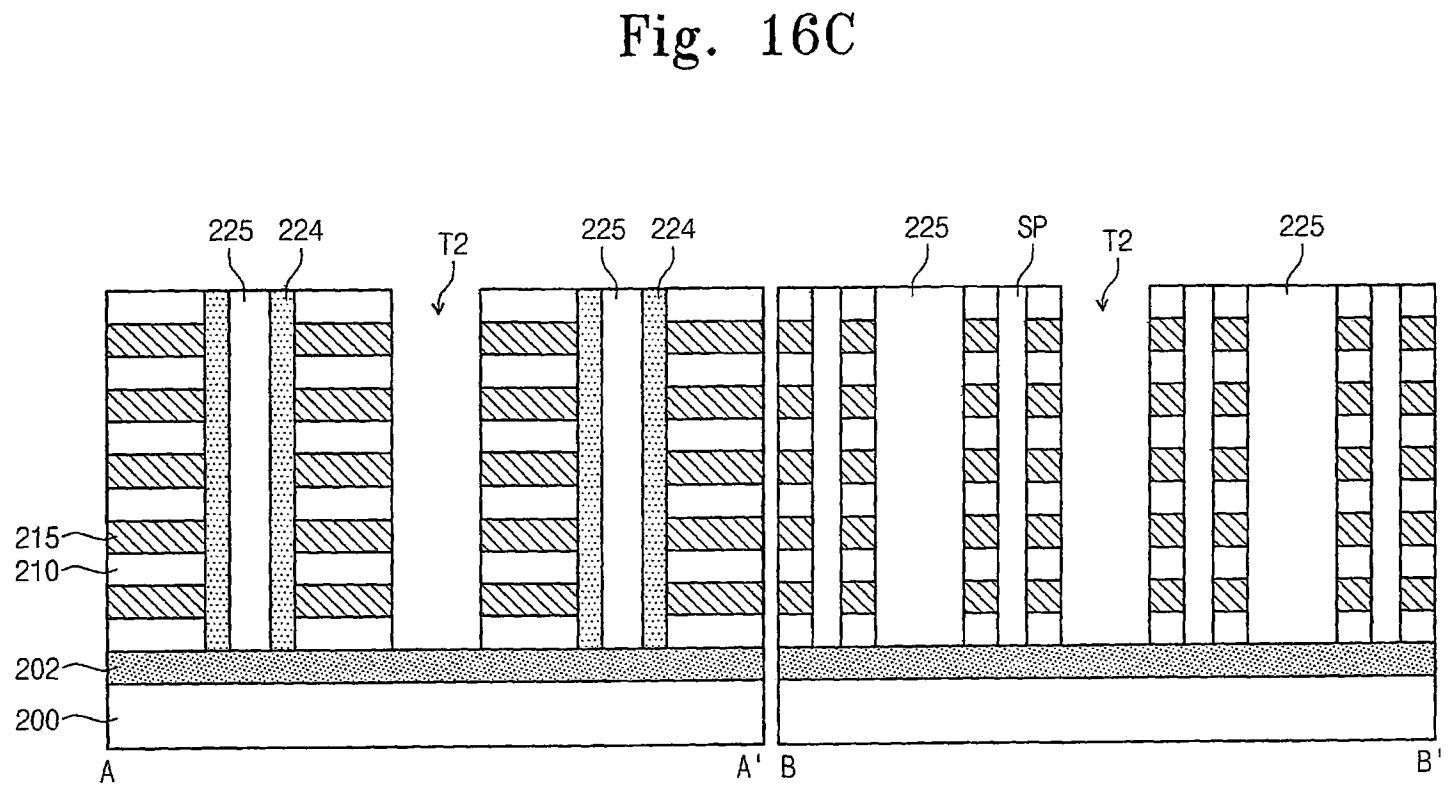

Referring to FIG. 16C, line-shaped second trenches T2 are formed at the stacked first and second dielectric layers 210 and 215 to expose the second sidewalls of the first and second dielectric layers 210 and 215. The second trenches T2 may be formed between the first trenches T1 to form line-shaped stack structures. The line-shaped stack structure includes the supporters SP at the edge portion.

Figure 16D:
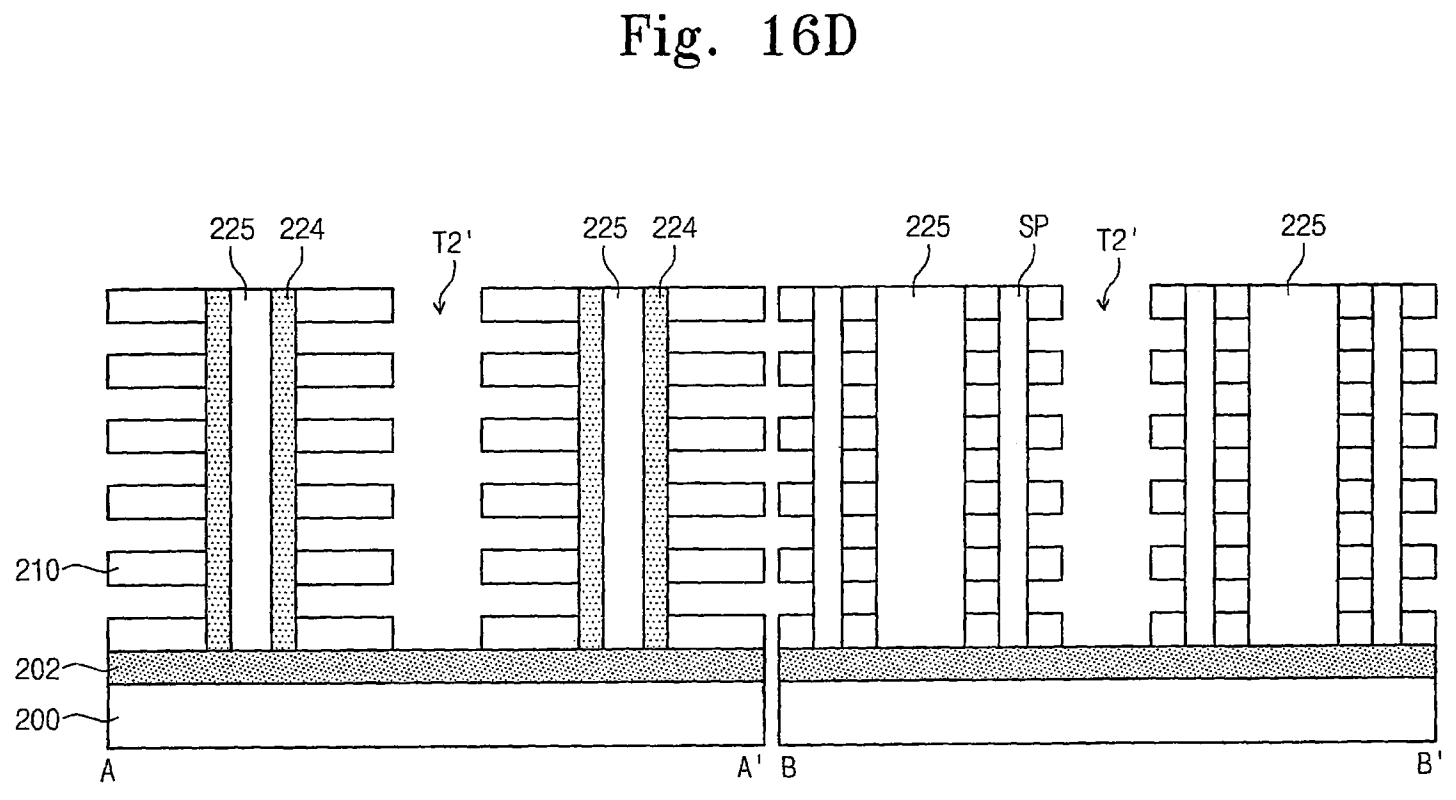

Referring to FIG. 16D, through a wet etch process, the second dielectric layers 215 between the stacked first dielectric layers 210 are removed. Accordingly, second trenches T2' exposing the sidewalls of the active pillars 224 may be formed. Herein, the supporters SP on the contact region CR are formed of a material having an etch selectivity with respect to the second dielectric layer 215, thus supporting the first dielectric layers 210 vertically spaced apart by a predetermined distance.

Figure 16E:
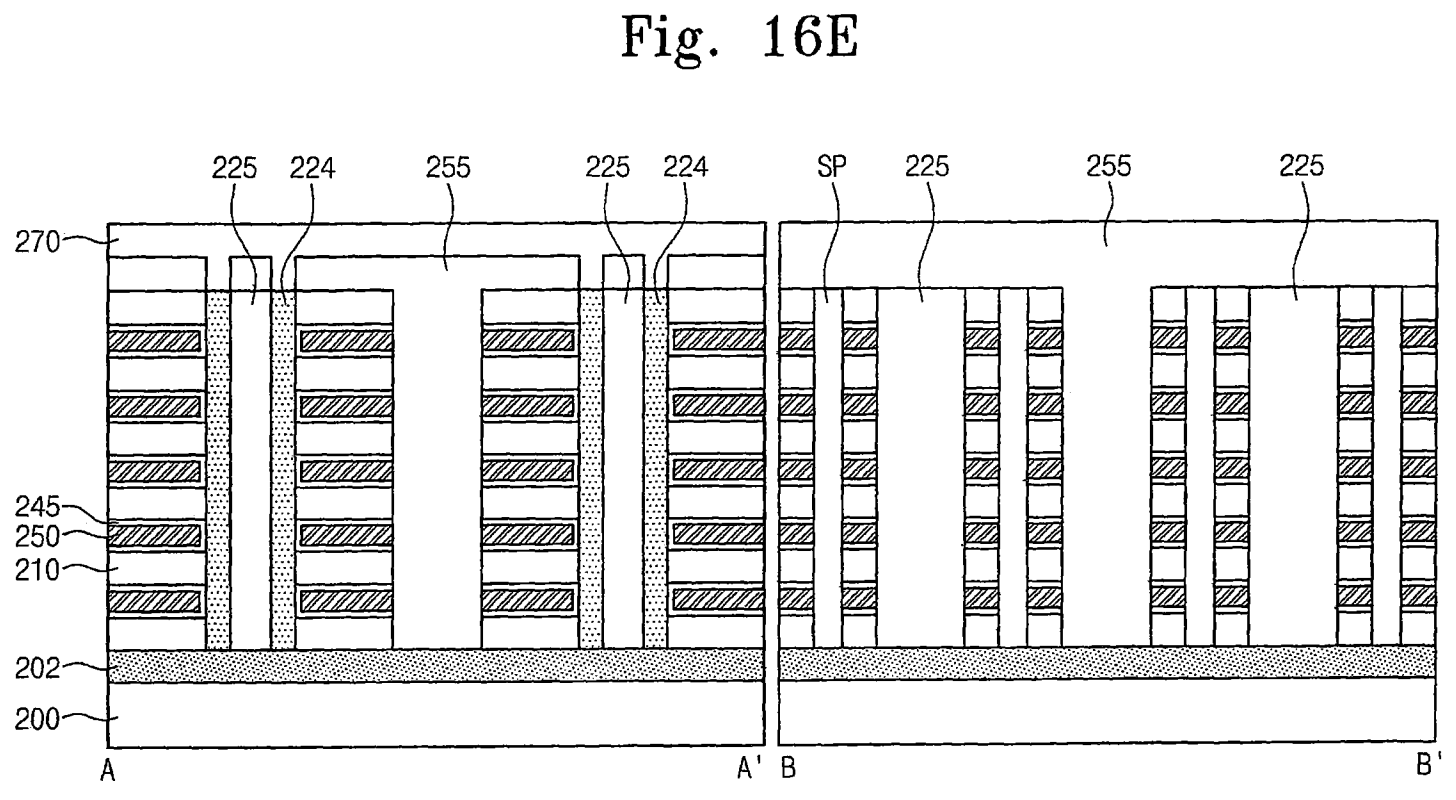

Referring to FIG. 16E, a charge storage layer 245 and a gate electrode 250 are sequentially formed in the second trenches T2'. Thereafter, the charge storage layer and a gate conductive layer may be patterned to form the charge storage layer 245 and the gate electrode 250 on/under the first dielectric layers 210. That is, the gate conductive layer in the second trench T2' may be separated into the line-shaped gate electrodes 250. Thereafter, the space between the line-shaped gate electrodes 250 may be filled with a dielectric layer 255. Thereafter, bit lines 270 connected electrically to the active pillars 224 may be formed on the stacked gate electrodes 250.

A method for fabricating the nonvolatile memory devices according to another exemplary embodiment of the inventive concept will be described below in detail with reference to FIGS. 17 to 24.

FIGS. 17 to 24 are sectional views illustrating a method for fabricating a nonvolatile memory device according to another exemplary embodiment of the inventive concept.

Figure 17:
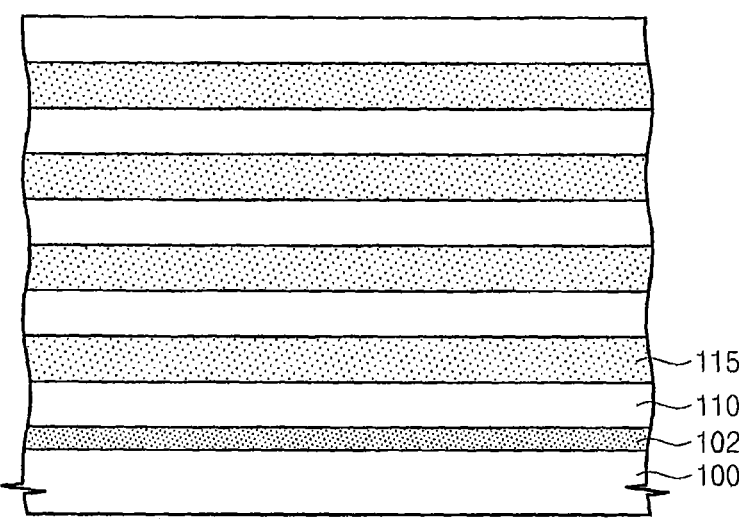

Referring to FIG. 17, first and second dielectric layers 110 and 115 with different etch rates are alternately stacked on a semiconductor substrate 100 of a memory cell region to form a stack structure. The semiconductor substrate 100 may include an impurity region (or well) 102, and the first and second dielectric layers 110 and 115 may be stacked on the impurity region. The number of the stacked first and second dielectric layers 110 and 115 may depend on the memory capacity, and the height of the stack structure increases with an increase in the memory capacity. Also, the second dielectric layer 115 may be formed of a material with a higher wet etch rate than the first dielectric layer 110. For example, the first and second dielectric layers 110 and 115 may be formed of silicon oxide and silicon nitride, respectively, and may be formed of silicon oxides with different wet etch rates.

Figure 18:
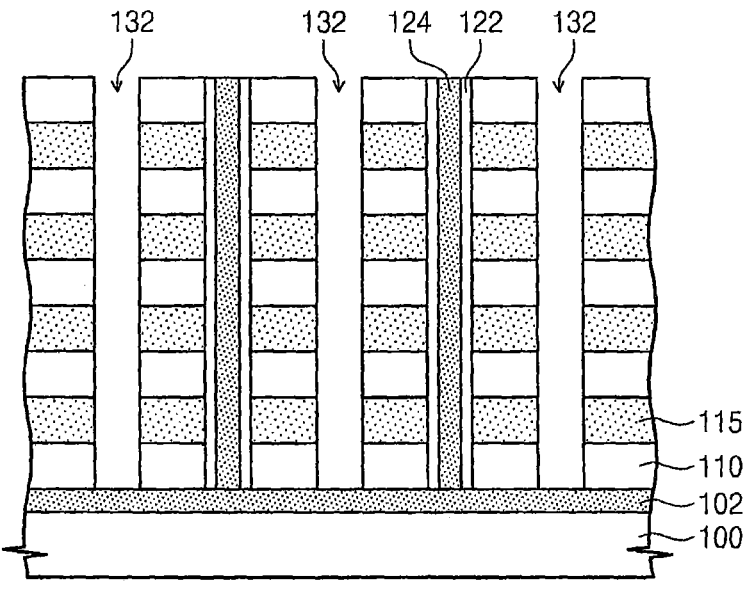

Referring to FIG. 18, active pillars 124 are formed in the central portion of the stack structure (i.e., the memory cell region).

More specifically, channel holes, penetrating the first and second dielectric layers 110 and 115 to expose the semiconductor substrate 100, are formed in the central portion of the stack structure (i.e., the memory cell region). The channel holes may be formed through a photolithography process, and the channel holes may be formed in a matrix configuration in the plane of the substrate.

Thereafter, a charge storage layer 122 is formed on the inside walls of the channel holes, and the channel holes are filled with semiconductor material to form active pillars 124. The charge storage layer 122 may be deposited conformally along the surfaces of the channel holes, and the charge storage layer 122 deposited on the surface of the semiconductor substrate 100 may be removed. Specifically, the charge storage layer 122 includes charge tunneling layer, a charge trapping layer, and a charge blocking layer. In another exemplary embodiment, the charge storage layer 122 may be formed through the subsequent process. That is, the charge storage layer 122 may be formed to surround the active layers 124 and vertical supporters.

The active pillars 124 may be formed by filling the channel holes with semiconductor material. The semiconductor material may be monocrystalline or polycrystalline semiconductor material. The active pillars 124 may be formed by performing an epitaxial process using the semiconductor substrate 100 as a seed layer, or by depositing semiconductor material. The active pillars 124 filling the channel holes may be connected to the semiconductor substrate 100.

Thereafter, the stack structure including the active pillars 124 is patterned to form line-type stack structures. Specifically, trenches 132 penetrating the first and second dielectric layers 110 and 115 may be formed between the active pillars 124 to form line-type stack structures.

The trenches 132 may be formed through a photolithography process, and the impurity region 102 of the semiconductor substrate 100 may be exposed by the trenches 132. The trenches 132 may be formed in a line shape, and may be formed to be parallel to each other and spaced apart from each other by a predetermined distance. In this manner, one sidewall of the stacked first and second dielectric layers 110 and 115 may be exposed by the trenches 132.

Figure 19:
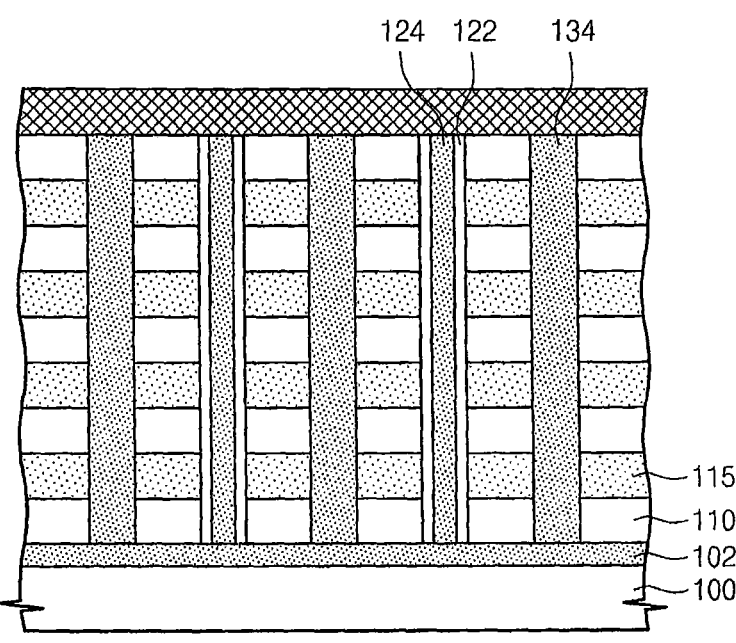

Referring to FIG. 19, the trenches 132 between the line-type stack structures are filled with a sacrificial dielectric layer 134, and it is planarized to expose the uppermost first dielectric layer 110. The sacrificial dielectric layer 134 may be formed of a material having an etch selectivity with respect to the first dielectric layer 110. In an exemplary embodiment, the sacrificial dielectric layer 134 may be formed of the same material as the second dielectric layer 115 so that it can be removed simultaneously with the second dielectric layer 115 through the subsequent process. Thereafter, horizontal supporters 140 are formed on the line-type stack structures. The horizontal structures 140 serve to prevent the line-type stack structures (i.e., the active pillars 124) from collapsing while removing the second dielectric layers 115 of the line-type stack structures and forming conductive patterns between the first dielectric layers 110 in the subsequent processes.

Figure 20A:
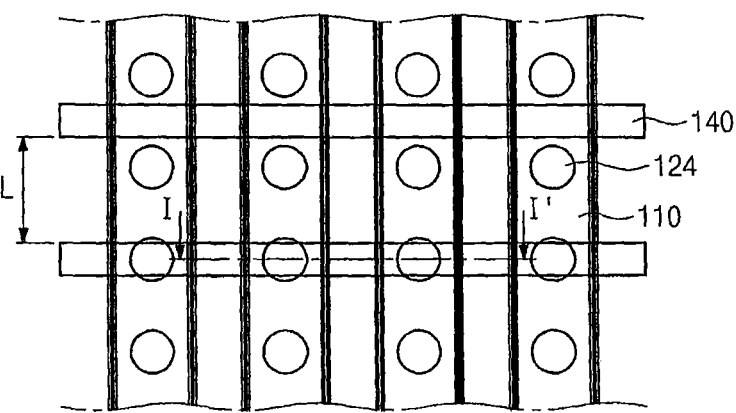
Figure 20B:
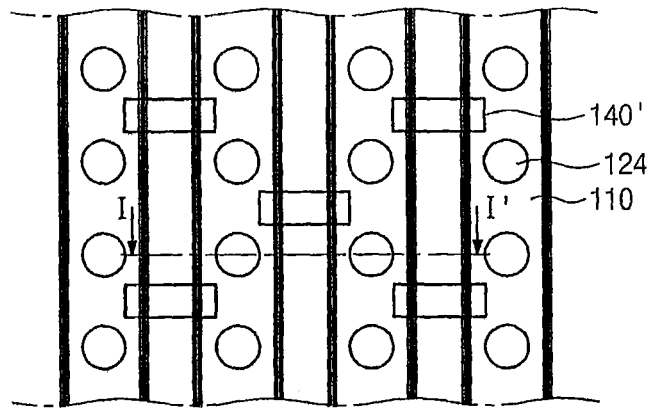
Figure 21:
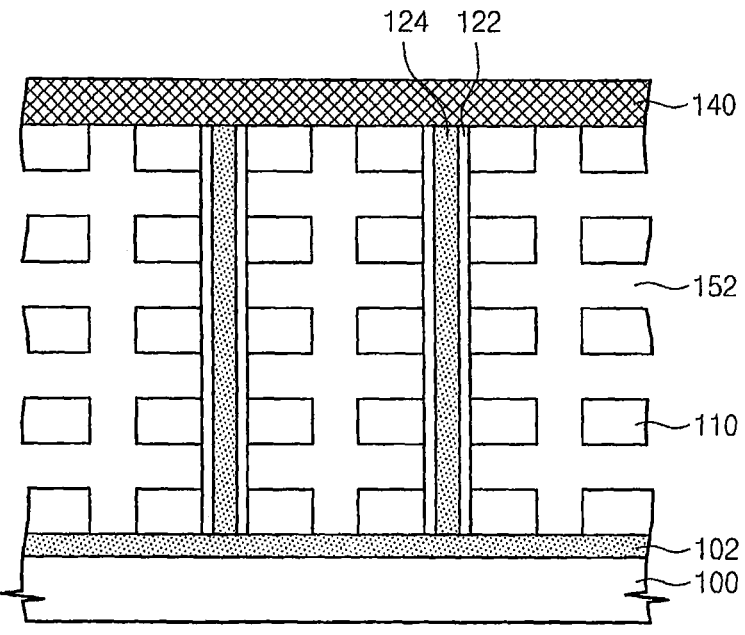

FIGS. 20A and 20B illustrate the planar structure of the horizontal supporters in the nonvolatile memory device fabrication method according to the exemplary embodiments of the inventive concept.

Referring to FIGS. 19 and 20A, the horizontal supporters 140 are formed across the line-type stack structures, and may be formed to contact the top surfaces of the line-type stack structures. Also, the horizontal supporters 140 are spaced apart from each other to expose portions of the sacrificial dielectric layers 134.

Specifically, the horizontal supporters 140 may be formed by forming a material layer having an etch selectivity with respect to the second dielectric layer 115 on the line-type stack structure and patterning the material layer in a line shape. The horizontal supporters 140 may be formed of the same dielectric material as the first dielectric layer 110, and may also be formed of semiconductor material or metal material. That is, the horizontal supporters 140 intersect the line-type stack structures while contacting the top surfaces of the line-type stack structures. Also, the line-shaped horizontal supporters 140 may be disposed on or between the active pillars 124.

Although the horizontal supporters 140 are described herein as being disposed perpendicular to the line-type stack structures, the inventive concept is not limited to this configuration. The horizontal supporters 140 may intersect the top surfaces of the line-type stack structures at an angle.

Also, the horizontal supporters 140 may be formed at both side portions of the active pillars 124 disposed in a matrix configuration. That is, the horizontal supporters 140 may be formed across the top surfaces of the line-type stack structures at the edge portions of the memory cell region. That is, the interval (L) between the horizontal supporters 140 may vary according to circumstances.

Also, the horizontal supporters 140 may have a portion extending between the line-type stack structures (not illustrated). That is, the space between the portions extending from the horizontal supporters 140 may be filled with the sacrificial dielectric layer 134.

Referring to FIG. 20B, horizontal supporters 140' may include local patterns contacting the top surfaces of the line-type stack structures adjacent to each other.

Specifically, the space between the line-type stack structures is filled with the sacrificial dielectric layer 134. Thereafter, a material layer is formed on the line-type stack structures. Thereafter, the material layer is patterned to form localized horizontal supporter patterns 140' across the line-type stack structures. The horizontal supporter patterns 140' may be square or circular patterns, and may be arranged in a matrix configuration or in a radiation configuration. In this manner, the horizontal supporter patterns 140' also contact the adjacent line-type stack structures to prevent the collapse of the line-type stack structures.

Referring to FIG. 12, after the forming of the horizontal supporters 140, the sacrificial dielectric layer 134 between the line-type stack structures is removed to expose the sidewalls of the line-type stack structures. That is, the sidewalls of the first and second dielectric layers 110 and 115 are exposed. The sacrificial dielectric layer 134 may be removed through an anisotropic or isotropic etch process. For example, a wet etchant may be supplied to the top surface of the sacrificial dielectric layer 134 to remove the sacrificial dielectric layer 134. The horizontal supporters 140 are formed of a material having an etch selectivity with respect to the sacrificial dielectric layer 134. Therefore, when the sacrificial dielectric layer 134 is removed, the horizontal supporters 140 are left on the line-type stack structures spaced apart from each other. Accordingly, the top surfaces of the line-type stack structures spaced apart from each other are fixed by the horizontal supporters 140, thereby preventing the collapse of the line-type stack structures. That is, the horizontal supporters 140, which intersect the top surfaces of the line-type stack structures spaced apart from each other, can maintain the interval between the line-type stack structures. Also, trenches may be reformed between the line-type stack structures.

Thereafter, in order to form conductive patterns (i.e., gate electrodes) between the vertically-stacked first dielectric layers 110, the second dielectric layers 115 between the first dielectric layers 110 are removed from the line-type stack structure. That is, openings 152 exposing the charge storage layer 122 are formed between the vertically-stacked first dielectric layers 110. If the second dielectric layers 115 are formed of the same material as the sacrificial dielectric layer 134, the sacrificial dielectric layer 134 and the second dielectric layers 115 may be sequentially removed through an isotropic etch process.

The horizontal supporters 140 may bee formed of a material having an etch selectivity with respect to the second dielectric layers 115. Therefore, the horizontal supporters 140 may be left on the top surfaces of the line-type stack structures during the removing of the second dielectric layers 115. That is, the horizontal supporters 140 maintain the interval between the line-type stack structures to prevent the collapse of the line-type stack structures.

Figure 22:
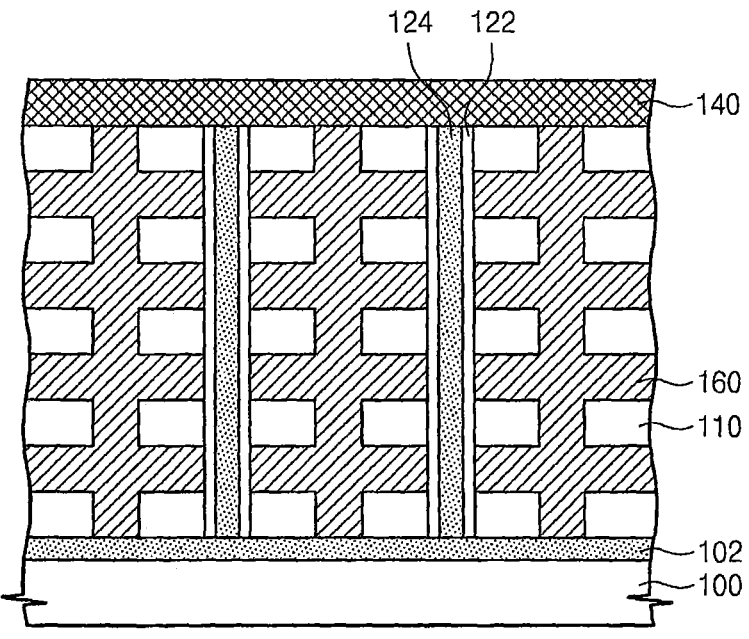

Referring to FIG. 22, after the removing of the second dielectric layers 115, the openings 152 are filled with a conductive layer 160. The conductive layer 160 may be formed of polysilicon, metal, silicide, or a combination thereof. At the filling of the openings 152 with the conductive layer 160, the space between the horizontally-adjacent first dielectric layers 110 may also be filled with the conductive layer 160.

Figure 23:
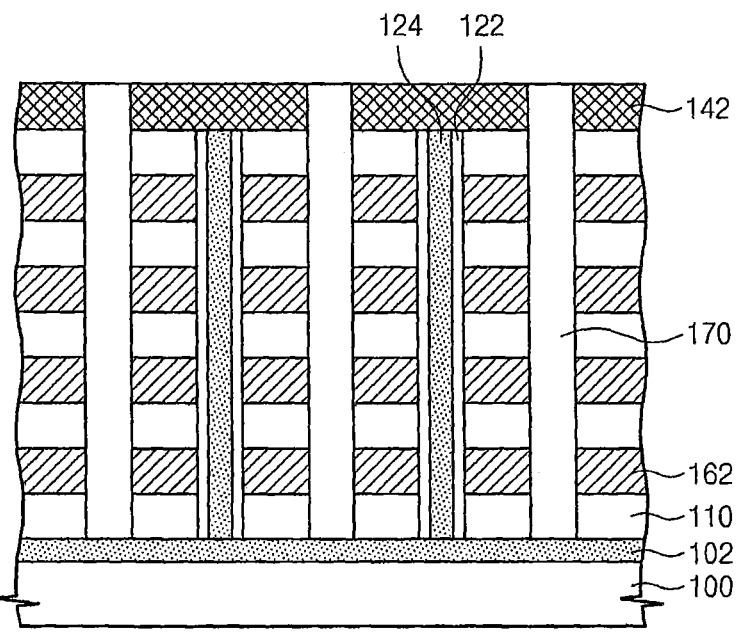

When the space between the first dielectric layers 110 is filled with the conductive layer 160, the conductive layer 160 between the horizontally-adjacent first dielectric layers 110 is anisotropically etched as illustrated in FIG. 23. That is, the trench 132 may be reformed between the first dielectric layers 110, so that local conductive patterns 162 are formed respectively in the openings 152. That is, the conductive patterns 162 of the respective layers may be separated.

Also, in order to remove the conductive layers 160 between the first dielectric layers 110, a portion of the horizontal supporter 140 intersecting the line-type stack structures may be removed. If the horizontal supporters 140 are formed of semiconductor material or conductive material, the horizontal supporters 140 may be removed after the forming of the conductive patterns 162 in the openings 152.

As the local conductive patterns 162 are formed in the openings 152, three-dimensional word lines may be formed on the semiconductor substrate 100. Also, the active pillars 124 are connected to the semiconductor substrate 100 by penetrating the stacked conductive lines.

According to another exemplary embodiment of the inventive concept, after the openings 152 are formed between the vertically-adjacent first dielectric layers 110, the conductive patterns 162 may be formed selectively in the openings 152 through a selective deposition or plating process. After the filling of the openings 152 with the conductive layer, a process of separating the conductive patterns 162 of the respective layer may be omitted.

After the forming of the local conductive patterns 162 in the openings 152, the space between the horizontally-adjacent conductive patterns 162 is filled with a dielectric layer 170. The space between the horizontally-adjacent conductive patterns 162 may be filled with the dielectric layer 170 up to the horizontal supporters 142. That is, after the forming of the three-dimensional conductive patterns 162 on the semiconductor substrate 100, the horizontal supporters 142 may be provided as a portion of the dielectric layer.

Figure 24:
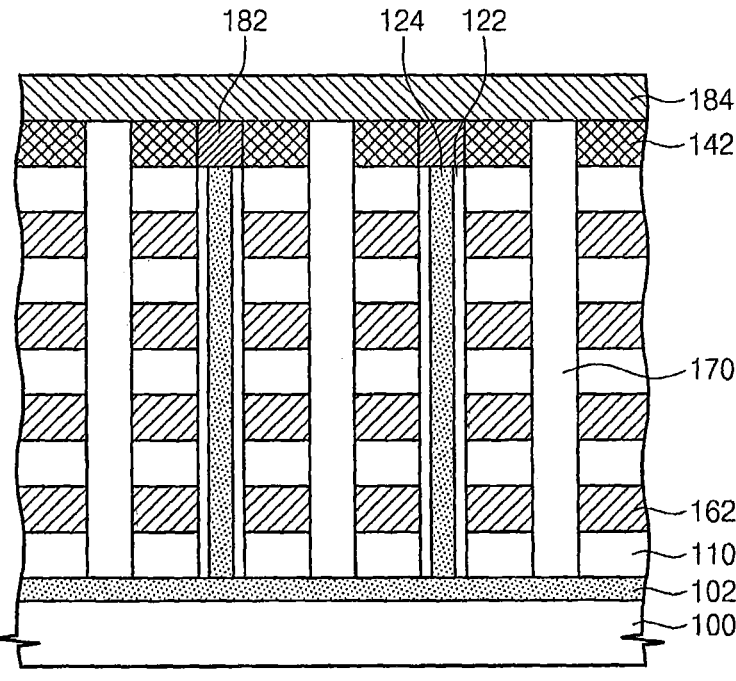

Referring to FIG. 24, bit lines 184 connected through contact plugs 182 to the active pillars 124 may be formed on the dielectric layer 170 and the horizontal supporters 142. The bit lines 184 may be formed across the three-dimensional word lines 162.

In the fabrication of the nonvolatile memory device, the horizontal supporters 124 described with reference to FIGS. 17 and 24 may be combined with the aforesaid vertical supporters 230 and 224b.

FIG. 25 is a block diagram of a memory system including a nonvolatile memory device according to exemplary embodiments of the inventive concept.

Referring to FIG. 25, a memory system 1100 may be applicable to PDAs, portable computers, Web tablets, wireless phones, mobile phones, digital music players, memory cards, or any device that can transmit and/or receive information in wireless environments.

The memory system 1100 includes a controller 1110, an input/output device 1120 (e.g., a keypad, a keyboard, and a display), a memory 1130, an interface 1140, and a bus 1150. The memory 1130 and the interface 1140 communicate with each other through the bus 1150.

The controller 1110 includes at least one microprocessor, a digital signal processor, a microcontroller, or other similar processors. The memory 1130 may be used to store commands executed by the controller 1110. The input/output device 1120 may receive data or signals from the outside of the memory system 1100, or may output data or signals to the outside of the memory system 1100. For example, the input/output device 1120 may include a keyboard unit, a keypad unit, or a display unit.

The memory 1130 includes the nonvolatile memory devices according to the embodiments of the inventive concept. The memory 1130 may further include random-access volatile memories and other various types of memories.

The interface 1140 serves to transmit/receive data to/from a communication network.

FIG. 26 is a block diagram of a memory card provided with a flash memory device according to an exemplary embodiment of the inventive concept.

Referring to FIG. 26, a memory card 1200 is provided with a flash memory device 1210 according to the inventive concept to support high-capacity data storage capability. The memory card 1200 includes a memory controller 1220 that controls data exchange between a host and the flash memory device 1210.

An SRAM 1221 is used as a working memory of a central processing unit (CPU) 1222. A host interface (UF) 1223 has data exchange protocol of a host connected to the memory card 1200. An error correction block (ECC) 1224 detects and corrects an error in data read from the multi-bit flash memory device 1210. A memory interface (UF) 1225 interfaces with the flash memory device 1210. The CPU 1222 performs an overall control operation for data exchange of the memory controller 1220. Although not illustrated in FIG. 26, it will be apparent to those skilled in the art that the memory card 1200 may further include a ROM storing code data for interfacing with the host.

FIG. 27 is a block diagram of an information processing system provided with a flash memory system according to the inventive concept.

Referring to FIG. 27, an information processing system 1300, such as a mobile device and a desktop computer, is provided with a flash memory system 1310 according to the inventive concept. The information processing system 1300 includes a flash memory system 1310, a modem 1320, a central processing unit (CPU) 1330, a RAM 1340, and a user interface 1350 that are electrically connected to a system bus 1360. The flash memory system 1310 may have substantially the same configuration as the aforementioned memory system or flash memory system. Data processed by the CPU 1330 or external input data is stored in the flash memory system 1310. The flash memory system 1310 may be configured with a semiconductor disk device (SSD). In this case, the information processing system 1300 can stably store high-capacity data in the flash memory system 1310. Also, as the reliability of the semiconductor device is improved, the flash memory system 1310 can save resources consumed in error correction, thus providing a high-speed data exchange function to the information processing system 1300. Although not illustrated in FIG. 27, it will be apparent to those skilled in the art that the information processing system 1300 may further include an application chipset, a camera image processor (CIS), and an input/output device.

Also, the flash memory device or the memory system according to the inventive concept may be mounted in various types of packages. Examples of the packages of the flash memory device or the memory system according to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

As described above, according to the three-dimensional nonvolatile memory device of the inventive concept, the supporters are formed in the contact region, thereby making it possible to support the edge portions of the stacked gate electrodes. Also, when the wet etch process is performed for fabrication of the three-dimensional nonvolatile memory device, the interlayer dielectrics can be prevented from collapsing during the wet etch process.

Also, some or all of the three-dimensional stacked gate electrodes are comprised of metal material, thereby making it possible to reduce the resistance of the gate electrode. Therefore, the operation speed of the three-dimensional nonvolatile memory device can be improved.

Also, according to the method for fabricating the three-dimensional nonvolatile memory device of the inventive concept, the horizontal supporters are formed across the top surfaces of the line-type stack structures in order to form the three-dimensional conductive lines. Accordingly, the top surfaces of the high line-type stack structures can be fixed by the horizontal supporters. Therefore, the line-type stack structure can be prevented from inclining or collapsing when forming the openings between the stacked first dielectric layers.

Also, the vertical supporters penetrating the stacked dielectric layers are formed at the edge portions of the line-type stack structure, thereby making it possible to prevent the first dielectric layers from collapsing when forming the openings between the stacked first dielectric layers.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A three-dimensional semiconductor device comprising:
   a substrate including a first region and a second region;
   a stacked structure including a plurality of horizontal layers and a plurality of insulating layers alternately stacked on the substrate, the stacked structure having a staircase portion on the second region;
   a plurality of channel hole structures extending through the stacked structure on the first region, each of the plurality of channel hole structures including an active pattern and a charge storage layer;
   a plurality of bit lines electrically connected to the plurality of channel hole structures; and
   a plurality of dummy hole structures extending through the stacked structure on the second region,
   wherein the charge storage layer extends between the active pattern and ones of the plurality of horizontal layers, and
   wherein at least one of the dummy hole structures extends from an uppermost one of the horizontal layers to a lowermost one of the horizontal layers and is free of electrical connection with any bit lines.

2. The three-dimensional semiconductor device of claim 1, wherein respective ones of the dummy hole structures penetrate all or some of the horizontal layers.

3. The three-dimensional semiconductor device of claim 1, further comprising:
   a plurality of contact plugs on the second region and electrically connected to respective ones of the plurality of horizontal layers; and
   a plurality of conductive lines electrically connected to the plurality of contact plugs.

4. The three-dimensional semiconductor device of claim 3, wherein the plurality of contact plugs have different respective vertical lengths on the second region, and
   wherein the vertical lengths increase with increasing distance from the first region.

5. The three-dimensional semiconductor device of claim 3, wherein at least one of the plurality of dummy hole structures is located between adjacent ones of the contact plugs.

6. The three-dimensional semiconductor device of claim 3, wherein the plurality of dummy hole structures are free of electrical connection with any conductive lines.

7. The three-dimensional semiconductor device of claim 1, wherein each of the horizontal layers has an end portion on the second region, and
   wherein the end portions of the horizontal layers are horizontally spaced apart from each other.

8. The three-dimensional semiconductor device of claim 1, wherein the plurality of dummy hole structures have different respective vertical lengths on the second region.

9. The three-dimensional semiconductor device of claim 1, wherein the plurality of dummy hole structures have different respective vertical lengths on the second region, and wherein the vertical lengths decrease with increasing distance from the first region.

10. The three-dimensional semiconductor device of claim 1, wherein the horizontal layers comprise conductive material on the first region and the second region.

11. The three-dimensional semiconductor device of claim 1, further comprising a planarized dielectric layer covering the staircase portion of the stacked structure, wherein at least one of the plurality of dummy hole structures penetrates the staircase portion of the stacked structure.

12. A three-dimensional semiconductor device comprising:

a substrate including a first region and a second region;

a stacked structure including a plurality of horizontal layers and a plurality of insulating layers alternately stacked on the substrate, the stacked structure including a first portion on the first region and a second portion on the second region, the second portion of the stacked structure having a staircase portion on the second region;

a plurality of channel hole structures extending through the first portion of the stacked structure on the first region; and a plurality of dummy hole structures extending through the second portion of the stacked structure on the second region, wherein the plurality of dummy hole structures include a first dummy hole structure which is disposed closest to the channel hole structures, wherein the first dummy hole structure has a top surface located at the same level as top surfaces of the channel hole structures, and wherein the plurality of dummy hole structures include a second dummy hole structure extending through a lowermost one of the plurality of horizontal layers on the second region.

13. The three-dimensional semiconductor device of claim 12, further comprising a plurality of contact plugs on the second region and electrically connected to respective ones of the plurality of horizontal layers, wherein at least one of the plurality of dummy hole structures is located between adjacent ones of the contact plugs.

14. The three-dimensional semiconductor device of claim 13, further comprising a plurality of conductive lines electrically connected to the plurality of contact plugs, wherein the plurality of dummy hole structures are free of electrical connection with any conductive lines.

15. The three-dimensional semiconductor device of claim 12, wherein respective ones of the dummy hole structures penetrate all or some of the horizontal layers.

16. The three-dimensional semiconductor device of claim 12, wherein each of the horizontal layers has an end portion on the second region, wherein the end portions of the horizontal layers are horizontally spaced apart from each other, and wherein respective ones of the plurality of dummy hole structures penetrate respective ones of the end portions of the horizontal layers.

17. The three-dimensional semiconductor device of claim 12, wherein the plurality of dummy hole structures have different respective vertical lengths on the second region, and wherein a top surface of the second dummy hole structure is non-coplanar with the top surface of the first dummy hole structure.

18. The three-dimensional semiconductor device of claim 12, wherein a bottom surface of the first dummy hole structure is coplanar with a bottom surface of the second dummy hole structure.

19. A three-dimensional semiconductor device comprising:

a substrate including a first region and a second region;

a stacked structure including a plurality of horizontal layers and a plurality of insulating layers alternately stacked on the substrate, the stacked structure having a staircase portion on the second region;

a plurality of channel hole structures extending through the stacked structure on the first region; and a plurality of dummy hole structures extending through the stacked structure on the second region, the plurality of dummy hole structures comprising dielectric material, wherein at least one of the plurality of dummy hole structures penetrates the plurality of horizontal layers in the staircase portion of the stacked structure.

20. The three-dimensional semiconductor device of claim 19, wherein the plurality of dummy hole structures include a first dummy hole structure that extends through a first non-zero number of the horizontal layers, and a second dummy hole structure that extends through a second non-zero number of the horizontal layers that is different from the first non-zero number.

* * * * *